United States Patent
Ikenaga et al.

(10) Patent No.: US 9,595,630 B2
(45) Date of Patent: Mar. 14, 2017

(54) SOLAR CELL SEALING MATERIAL, METHOD FOR MANUFACTURING SOLAR CELL SEALING MATERIAL, AND SOLAR CELL MODULE

(75) Inventors: Shigenobu Ikenaga, Chiba (JP); Fumito Takeuchi, Chiba (JP); Keiji Watanabe, Ichihara (JP); Tomoaki Ito, Ichihara (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 285 days.

(21) Appl. No.: 14/239,143

(22) PCT Filed: Aug. 16, 2012

(86) PCT No.: PCT/JP2012/005170
§ 371 (c)(1),
(2), (4) Date: Feb. 16, 2014

(87) PCT Pub. No.: WO2013/024599
PCT Pub. Date: Feb. 21, 2013

(65) Prior Publication Data
US 2014/0202536 A1   Jul. 24, 2014

(30) Foreign Application Priority Data
Aug. 18, 2011   (JP) .................................. 2011-178908

(51) Int. Cl.
*H01L 31/0203* (2014.01)
*H01L 31/18* (2006.01)
(Continued)

(52) U.S. Cl.
CPC ................ *H01L 31/18* (2013.01); *C08K 5/14* (2013.01); *C08K 5/5425* (2013.01);
(Continued)

(58) Field of Classification Search
CPC ............ H01L 311/0481; H01L 311/18; H01L 311/0488; C08K 5/14; C08K 5/5425; C08L 2312/00; C08L 2312/08
(Continued)

(56) References Cited

U.S. PATENT DOCUMENTS

| 3,864,433 A | 2/1975 | Tatsukami et al. |
| 2009/0023867 A1* | 1/2009 | Nishijima ......... B32B 17/10697 525/387 |

(Continued)

FOREIGN PATENT DOCUMENTS

| CN | 101563786 A1 | 10/2009 |
| EP | 1 857 500 A1 | 11/2007 |

(Continued)

OTHER PUBLICATIONS

Chinese Office Action corresponding to Application No. 201280039258.1, dated May 15, 2015.

(Continued)

*Primary Examiner* — Jayne Mershon
(74) *Attorney, Agent, or Firm* — Foley & Lardner LLP

(57) ABSTRACT

An encapsulating material for solar cell containing an ethylene/α-olefin copolymer satisfying the following a1) and a2), and a specific peroxyketal having a 1-hour half-life temperature in a range of 100 to 135 degrees centigrade; the peroxyketal being contained in an amount of 0.1 to less than 0.8 weight parts relative to 100 weight parts of the ethylene/α-olefin copolymer.
  a1) the shore A hardness is from 60 to 85 as measured in accordance with ASTM D2240.
  a2) MFR is from 2 to 50 g/10 minutes as measured under the conditions of a temperature of 190 degrees centigrade and a load of 2.16 kg in accordance with ASTM D1238.

15 Claims, 2 Drawing Sheets

(51) Int. Cl.
  *C08K 5/14* (2006.01)
  *H01L 31/048* (2014.01)
  *C09D 123/08* (2006.01)
  *C08K 5/5425* (2006.01)

(52) U.S. Cl.
  CPC .... *C09D 123/0815* (2013.01); *H01L 31/0481* (2013.01); *H01L 31/0488* (2013.01); *C08L 2312/00* (2013.01); *C08L 2312/08* (2013.01); *Y02E 10/50* (2013.01)

(58) Field of Classification Search
  USPC ........................................................ 136/251
  See application file for complete search history.

(56) References Cited

U.S. PATENT DOCUMENTS

| | | | |
|---|---|---|---|
| 2009/0159129 A1 | 6/2009 | Kataoka et al. | |
| 2010/0069538 A1* | 3/2010 | Kempe | H01L 31/048 524/91 |
| 2010/0229944 A1* | 9/2010 | Nishijima | B32B 17/10697 136/258 |
| 2012/0000514 A1 | 1/2012 | Amamiya et al. | |
| 2013/0118583 A1 | 5/2013 | Patel et al. | |
| 2013/0167911 A1 | 7/2013 | Ikenaga et al. | |
| 2013/0213471 A1 | 8/2013 | Ikenaga et al. | |

FOREIGN PATENT DOCUMENTS

| | | |
|---|---|---|
| EP | 2 003 701 A1 | 12/2008 |
| EP | 2 416 375 A1 | 2/2012 |
| FR | 2226410 A1 | 11/1974 |
| JP | 2010-053298 A | 3/2010 |
| JP | 2010-212357 A | 9/2010 |
| JP | 2010-226046 A | 10/2010 |
| JP | 2011-003783 A | 1/2011 |
| WO | WO-2006/085603 A1 | 8/2006 |
| WO | WO-2010/114028 A1 | 10/2010 |
| WO | WO-2012/046456 A1 | 4/2012 |
| WO | WO-2012/060086 A1 | 5/2012 |

OTHER PUBLICATIONS

International Search Report dated Sep. 18, 2012 received in International Application No. PCT/JP2012/005170.

European Search Report issued in Application No. 12824181.7 dated Mar. 11, 2015.

* cited by examiner

SOLAR CELL SEALING MATERIAL, METHOD FOR MANUFACTURING SOLAR CELL SEALING MATERIAL, AND SOLAR CELL MODULE

CROSS-REFERENCE TO RELATED APPLICATIONS

This application is the National Phase of PCT/JP2012/005170, filed Aug. 16, 2012, which claims priority to Japanese Application No. 2011-178908, filed Aug. 18, 2011, the disclosures of which are hereby incorporated by reference in their entirety.

TECHNICAL FIELD

The present invention relates to an encapsulating material for solar cell, a method for producing an encapsulating material for solar cell and a solar cell module.

BACKGROUND ART

With growing concerns about global environmental issues and energy issues, a solar cell has been paid attention as an energy generating means. Such energy is clean with no concerns about drying up. When a solar cell is used in outdoor environment such as on the roof of a building, it is generally used in the form of a solar cell module.

The aforementioned solar cell module is generally produced according to the following procedures. First, a crystalline solar cell element formed from polycrystalline silicon, monocrystalline silicon or the like, or a thin film solar cell element obtained by forming an ultra-thin (several micrometers) film made of amorphous silicon or crystalline silicon onto a substrate of glass or the like, is manufactured. Next, in order to obtain a crystalline solar cell module, a protective sheet for a solar cell module (surface protective sheet), an encapsulating material sheet for solar cell, a crystalline solar cell element, an encapsulating material sheet for solar cell and a protective sheet for a solar cell module (back surface protective sheet) are laminated in this order. On the other hand, in order to obtain a thin film solar cell module, a thin film solar cell element, an encapsulating material sheet for solar cell and a protective sheet for a solar cell module (back surface protective sheet) are laminated in this order. Thereafter, a solar cell module is manufactured through a lamination method in which the laminated material is absorbed under vacuum and pressed with heating. Solar cell modules manufactured in this manner are weather-resistant and thus are suitable for use in outdoor environment such as on the roof of a building.

As an encapsulating film material for a solar cell, a film made of an ethylene/vinyl acetate (EVA) copolymer has been widely used because it is excellent in transparency, flexibility and adhesiveness. For example, Patent Document 1 discloses an encapsulating film excellent in both adhesiveness and film-forming properties consisting of a crosslinking agent and an EVA composition containing trimellitate.

Meanwhile, there has also been proposed the use of a resin composition for an encapsulating material for solar cell composed of an ethylene/α-olefin copolymer, an organic peroxide and a silane coupling agent excellent in rigidity and crosslinking efficiency as a sealing film material (For example, see Patent Document 2).

RELATED DOCUMENT

Patent Document

Patent Document 1: Japanese Laid-open Patent Publication No. 2010-53298

Patent Document 2: Publication No. WO2010-114028

DISCLOSURE OF THE INVENTION

However, when the EVA composition is used as a constituent material of an encapsulating material for solar cell, there is the risk of possibly affecting the solar cell element by the component such as acetic acid gas and other unwanted gas generated by decomposition of EVA. Furthermore, there was also an object to obtain a high resistance solar cell module.

On the other hand, a polyolefin composition has an advantage in that a high resistance solar cell module is obtained, as compared to an EVA composition. However, according to the review by the present inventors, a polyolefin based composition hardly satisfies all the various properties such as transparency, anti-blocking properties. Meanwhile, for the adhesive sheet composition for a solar cell disclosed in Patent Document 2, crosslinking characteristics are not sufficient, the crosslinking rate is slowed down, and bubbles are generated during the lamination and crosslinking process at the time of manufacturing a solar cell module and during long-term usage, and therefore wiring and cell are likely to be peeled off.

The present invention has been accomplished in view of the problems of the prior arts. An object of the present invention is to establish a clear guide for achieving desired properties, and to provide an encapsulating material for solar cell which is excellent in general properties such as transparency, flexibility, adhesiveness, electrical characteristics and crosslinking characteristics, and hardly generates bubbles inside a solar cell module, wherein the encapsulating material for solar cell contains an ethylene/α-olefin copolymer satisfying specific requirements and an organic peroxide of peroxyketals represented by the following general formula (1) and having a 1-hour half-life temperature in a range of 100 to 135 degrees centigrade. Another object of the present invention is to provide a solar cell module using the encapsulating material for solar cell.

In order to achieve the above objects, the present inventors have conducted an extensive study and as a result, the present inventors have found that a specific amount of an organic peroxide of peroxyketals represented by the following general formula (1) and having a 1-hour half-life temperature in a range of 100 to 135 degrees centigrade is contained in an ethylene/α-olefin copolymer having MFR and Shore A hardness satisfying specific requirements, whereby an encapsulating material for solar cell is excellent in general properties such as transparency, adhesiveness, flexibility, appearance, crosslinking characteristics and electrical characteristics, and hardly generates bubbles during the lamination and crosslinking process at the time of manufacturing a solar cell module, and during long-term usage. Thus, the present invention has been completed. That is, according to the present invention, there is provided an encapsulating material for solar cell as illustrated below.

[1] An encapsulating material for solar cell containing an ethylene/α-olefin copolymer satisfying the following a1) and a2)-1, and a peroxyketal represented by the following general formula (1) and having a 1-hour half-life temperature in a range of 100 to 135 degrees centigrade; the peroxyketal being contained in an amount of 0.1 to less than 0.8 weight parts relative to 100 weight parts of the ethylene/α-olefin copolymer.

a1) the shore A hardness is from 60 to 85 as measured in accordance with ASTM D2240.

a2)-1 MFR is from 10 to 50 g/10 minutes as measured under the conditions of a temperature of 190 degrees centigrade and a load of 2.16 kg in accordance with ASTM D1238.

[Chemical Formula 1]

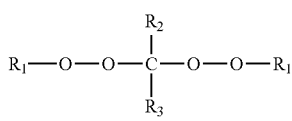

(1)

In the above general formula (1), $R_1$s are each independently a straight-chain or branched alkyl group having 3 to 8 carbon atoms, and $R_2$ and $R_3$ are each independently a straight-chain or branched alkyl group having 1 to 8 carbon atoms, or $R_2$ and $R_3$ may be bonded together to form an aliphatic ring having 5 to 9 carbon atoms or an alkyl-substituted aliphatic ring.

[2] The encapsulating material for solar cell according to the aforementioned [1], wherein the ethylene/α-olefin copolymer satisfies the following a3) and a4).

a3) the content ratio of structural units derived from ethylene is from 80 to 90 mol % and the content ratio of structural units derived from α-olefin having 3 to 20 carbon atoms is from 10 to 20 mol %;

a4) the density is from 0.865 to 0.884 g/cm³ as measured in accordance with ASTM D1505.

[3] The encapsulating material for solar cell according to the aforementioned [1], wherein the ethylene/α-olefin copolymer is an ethylene/α-olefin/non-conjugated polyene copolymer and satisfies the following a5).

a5) the content ratio of structural units derived from ethylene is from 80 to 90 mol %, the content ratio of structural units derived from α-olefin having 3 to 20 carbon atoms is from 9.99 to 19.99 mol %, and the content ratio of structural units derived from non-conjugated polyene is from 0.01 to 5.0 mol %.

[4] The encapsulating material for solar cell according to any one of the aforementioned [1] to [3], wherein the organic peroxide is at least one or more kinds selected from the following general formulae (2) to (4).

[Chemical Formula 2]

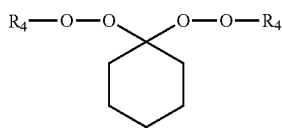

(2)

In the above general formula (2), $R_4$s each independently represent a straight-chain or branched alkyl group having 3 to 8 carbon atoms.

[Chemical Formula 3]

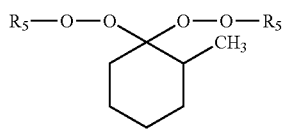

(3)

In the above general formula (3), $R_5$s each independently represent a straight-chain or branched alkyl group having 3 to 8 carbon atoms.

[Chemical Formula 4]

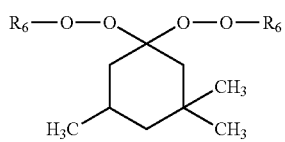

(4)

In the above general formula (4), $R_6$s each independently represent a straight-chain or branched alkyl group having 3 to 8 carbon atoms.

[5] The encapsulating material for solar cell according to any one of [1] to [4], wherein the encapsulating material for solar cell includes a silane coupling agent in an amount of 0.1 to 5 weight parts, based on 100 weight parts of the ethylene/α-olefin copolymer.

[6] The encapsulating material for solar cell according to [5], wherein the encapsulating material for solar cell further contains at least one kind selected from the group consisting of an ultraviolet absorber, a heat-resistant stabilizer and a hindered amine type light stabilizer in an amount of 0.005 to 5 weight parts, based on 100 weight parts of the ethylene/α-olefin copolymer.

[7] The encapsulating material for solar cell according to [6], wherein the encapsulating material for solar cell further contains a crosslinking aid in an amount of 0.05 to 5 weight parts, based on 100 weight parts of the ethylene/α-olefin copolymer.

[8] The encapsulating material for solar cell according to any one of [1] to [7], wherein the material is in a sheet form.

Also, according to the present invention, there is provided a method for producing an encapsulating material for solar cell as illustrated below.

[9] A method for manufacturing the encapsulating material for solar cell as described in the above [8], in which the resin composition containing the ethylene/α-olefin copolymer and the peroxyketal represented by the general formula (1) is molded into a film form by melt-extrusion molding.

Also, according to the present invention, there is provided an encapsulating material for solar cell as illustrated below.

[10] An encapsulating material for solar cell containing an ethylene/α-olefin copolymer satisfying the following a1) and a2)-2, and a peroxyketal represented by the above general formula (1) and having a 1-hour half-life temperature in a range of 100 to 135 degrees centigrade; the peroxyketal being contained in an amount of 0.1 to less than 0.8 weight parts relative to 100 weight parts of the ethylene/α-olefin copolymer.

a1) the shore A hardness is from 60 to 85 as measured in accordance with ASTM D2240.

a2)-2 MFR is more than 2 g/10 minutes and less than 10 g/10 minutes as measured under the conditions of a temperature of 190 degrees centigrade and a load of 2.16 kg in accordance with ASTM D1238.

[11] The encapsulating material for solar cell according to the aforementioned [10], wherein the ethylene/α-olefin copolymer satisfies the following a3), a4) and a5).

a3) the content ratio of structural units derived from ethylene is from 80 to 90 mol % and the content ratio of structural units derived from α-olefin having 3 to 20 carbon atoms is from 10 to 20 mol %;

a4) the density is from 0.865 to 0.884 g/cm$^3$ as measured in accordance with ASTM D1505.

a5) the content ratio of structural units derived from ethylene is from 80 to 90 mol %, the content ratio of structural units derived from α-olefin having 3 to 20 carbon atoms is from 9.99 to 19.99 mol %, and the content ratio of structural units derived from non-conjugated polyene is from 0.01 to 5.0 mol %.

[12] The encapsulating material for solar cell according to the aforementioned [10] or [11], wherein the organic peroxide is at least one or more kinds selected from the above general formulae (2) to (4).

[13] The encapsulating material for solar cell according to any one of the aforementioned [10] to [12], wherein the material is in a sheet form.

In addition, according to the present invention, there is provided an encapsulating material for solar cell as illustrated below.

[14] A method for manufacturing the encapsulating material for solar cell as described in the above [13], in which the resin composition containing the ethylene/α-olefin copolymer and the peroxyketal represented by the general formula (1) is molded into a film form by calender molding.

Furthermore, according to the present invention, there is provided a solar cell module as illustrated below.

[15] A solar cell module containing a surface protective member, a back surface protective member, a solar cell element, and a sealing layer for sealing the solar cell element between the surface protective member and the back surface protective member to be formed by crosslinking the encapsulating material for solar cell as described in the above [8] or [13].

According to the present invention, by the use of a specific ethylene/α-olefin copolymer and an organic peroxide of peroxyketals represented by the above general formula (1) and having a 1-hour half-life temperature in a range of 100 to 135 degrees centigrade, it is possible to provide an encapsulating material for solar cell which is excellent in general properties such as transparency, flexibility, adhesiveness, electrical characteristics and crosslinking characteristics, and hardly generates blisters at the time of manufacturing a solar cell module.

According to the present invention, by the use of such an encapsulating material for solar cell, an excellent balance among the aforementioned general properties is achieved, and in addition thereto, it is possible to avoid a trouble such that the encapsulating material is deformed even though the temperature is increased during usage of a solar cell module. It is possible to provide a solar cell module excellent in economic efficiency such as the costs or the like without damaging the appearance of the solar cell.

BRIEF DESCRIPTION OF THE DRAWINGS

The above and other objects, features and advantages of the present invention will be more apparent from the following description of certain preferred exemplary embodiments taken in conjunction with the accompanying drawings, in which.

Figure 1:
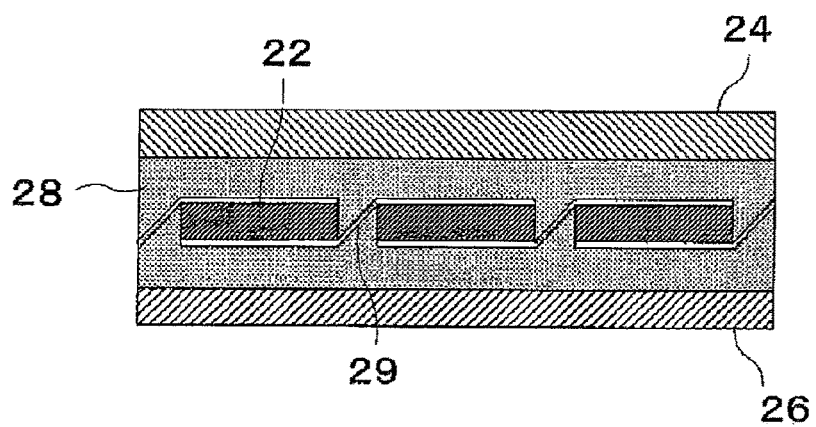
FIG. 1 is a cross sectional view schematically illustrating one exemplary embodiment of a solar cell module of the present invention.

20 solar cell module
22 solar cell element
22A light-incident surface (of solar cell element)
22B back surface (of solar cell element)
24 surface protective member
26 back surface protective member
28 encapsulating layer
29 interconnector
32 collector line
34A tab-type busbar
34B tab-type busbar
36 conductive layer

DESCRIPTION OF EMBODIMENTS

Exemplary embodiments of the present invention will be described below. It should be noted that, "number A to number B" represents "equal to or more than A and equal to or less than B" unless otherwise specifically noticed.

1. Encapsulating Material for Solar Cell

The encapsulating material for solar cell of the present invention contains an ethylene/α-olefin copolymer the following.

(Ethylene-α-Olefin Copolymer)

The ethylene/α-olefin copolymer used for the encapsulating material for solar cell of the present invention is obtained by copolymerizing ethylene with α-olefin having 3 to 20 carbon atoms. As α-olefin, usually, one α-olefin having 3 to 20 carbon atoms alone can be used, or two or more kinds thereof can be used in combination. Among these, preferable one is α-olefin having equal to or less than 10 carbon atoms, and notably preferable one is α-olefin having 3 to 8 carbon atoms. Concrete examples of the α-olefin include propylene, 1-butene, 1-pentene, 1-hexene, 3-methyl-1-butene, 3,3-dimethyl-1-butene, 4-methyl-1-pentene, 1-octene, and the like. Among these, preferable ones are propylene, 1-butene, 1-pentene, 1-hexene, 4-methyl-1-pentene and 1-octene from the viewpoint of availability. It should be noted that, the ethylene/α-olefin copolymer may be a random copolymer or a block copolymer, and preferable one is a random copolymer from the viewpoint of flexibility.

As a preferred embodiment of the ethylene/α-olefin copolymer used for the encapsulating material for solar cell of the present invention, it is also possible to use an ethylene/α-olefin/non-conjugated polyene copolymer. As α-olefin, usually, α-olefin having 3 to 20 carbon atoms may be used singly, or two or more α-olefins may be used in combination, in the same manner as in the ethylene/α-olefin copolymer.

As the non-conjugated polyene, compounds having two or more non-conjugated unsaturated bonds can be employed without limitation. Specifically, as the non-conjugated polyene, both a non-conjugated cyclic polyene and a non-conjugated chain polyene can be employed. Two or more of non-conjugated cyclic polyenes and non-conjugated chain polyenes can also be used in combination. Moreover, the non-conjugated polyene can be a non-conjugated polyene having only one catalytically polymerizable carbon-carbon double bond in one molecule, and a non-conjugated polyene having two catalytically polymerizable carbon-carbon double bonds in one molecule among carbon-carbon double bonds. Meanwhile, a chain polyene terminated with vinyl group ($CH_2=CH-$) on both ends is not defined as the non-conjugated polyene having only one polymerizable carbon-carbon double bond in one molecule. When two or more carbon-carbon double bonds exist in such a non-conjugated polyene, it is preferable that only one of the carbon-carbon double bonds exists in the vinyl group at the molecular terminal, with the other carbon-carbon double bond ($C=C$) within the molecular chain (including main and side chains) of the internal olefin structure. The scope of non-conjugated cyclic polyene and non-conjugated chain polyene includes the above-described non-conjugated polyene having only one catalytically polymerizable carbon-carbon double bond in one molecule, and the above-described non-conjugated polyene having two catalytically polymerizable carbon-carbon double bonds in one molecule among carbon-carbon double bonds. The conjugated chain polyenes include conjugated trienes or tetraenes.

Specific examples of the non-conjugated polyene include compounds described in paragraphs [0061] to [0084] of International Publication Pamphlet No. 2005/105867 and compounds described in paragraphs [0026] to [0035] of Japanese Patent Laid-open No. 2008-308696.

In particular, examples of the non-conjugated chain polyene include 1,4-hexadiene, 1,5-heptadiene, 1,6-octadiene, 1,7-nonadiene, 1,8-decadiene, 1,12-tetradecadiene, 3-methyl-1,4-hexadiene, 4-methyl-1,4-hexadiene, 5-methyl-1,4-hexadiene, 4-ethyl-1,4-hexadiene, 3,3-dimethyl-1,4-hexadiene, 5-methyl-1,4-heptadiene, 5-ethyl-1,4-heptadiene, 5-methyl-1,5-heptadiene, 6-methyl-1,5-heptadiene, 5-ethyl-1,5-heptadiene, 4-methyl-1,4-octadiene, 5-methyl-1,4-octadiene, 4-ethyl-1,4-octadiene, 5-ethyl-1,4-octadiene, 5-methyl-1,5-octadiene, 6-methyl-1,5-octadiene, 5-ethyl-1,5-octadiene, 6-ethyl-1,5-octadiene, 6-methyl-1,6-octadiene, 7-methyl-1,6-octadiene, 6-ethyl-1,6-octadiene, 6-propyl-1,6-octadiene, 6-butyl-1,6-octadiene, 7-methyl-1,6-octadiene, 4-methyl-1,4-nonadiene, 5-methyl-1,4-nonadiene, 4-ethyl-1,4-nonadiene, 5-ethyl-1,4-nonadiene, 5-methyl-1,5-nonadiene, 6-methyl-1,5-nonadiene, 5-ethyl-1,5-nonadiene, 6-ethyl-1,5-nonadiene, 6-methyl-1,6-nonadiene, 7-methyl-1,6-nonadiene, 6-ethyl-1,6-nonadiene, 7-ethyl-1,6-nonadiene, 7-methyl-1,7-nonadiene, 8-methyl-1,7-nonadiene, 7-ethyl-1,7-nonadiene, 5-methyl-1,4-decadiene, 5-ethyl-1,4-decadiene, 5-methyl-1,5-decadiene, 6-methyl-1,5-decadiene, 5-ethyl-1,5-decadiene, 6-ethyl-1,5-decadiene, 6-methyl-1,6-decadiene, 6-ethyl-1,6-decadiene, 7-methyl-1,6-decadiene, 7-ethyl-1,6-decadiene, 7-methyl-1,7-decadiene, 8-methyl-1,7-decadiene, 7-ethyl-1,7-decadiene, 8-ethyl-1,7-decadiene, 8-methyl-1,8-decadiene, 9-methyl-1,8-decadiene, 8-ethyl-1,8-decadiene, 6-methyl-1,6-undecadiene, 9-methyl-1,8-undecadiene and the like.

Examples of the conjugated trienes or tetraenes include 4-ethylidene-8-methyl-1,7-nonadiene, 6,10-dimethyl-1,5,9-undecatriene, 5,9-dimethyl-1,4,8-decatriene, 4,8-dimethyl-1,4,8-decatriene, 6,9-dimethyl-1,5,8-decatriene, 6,8,9-trimethyl-1,5,8-decatriene, 6,10,14-trimethyl-1,5,9,13-pentadecatetraene, 6-ethyl-10-methyl-1,5,9-undecatriene, 4-ethylidene-8,12-dimethyl-1,7,11-tridecatriene and the like. These non-conjugated chain polyenes may be used singly, or two or more kinds may be used in combination. Preferably used are 7-methyl-1,6-octadiene, 4,8-dimethyl-1,4,8-decatriene and the like.

An example of the non-conjugated polyene having only one polymerizable carbon-carbon double bond in one molecule includes a polyene composed of an alicyclic moiety having one carbon-carbon double bond (unsaturated bond) and of a chain moiety having an internal olefin bond (carbon-carbon double bond) that undergoes no or less metallocene-catalyzed polymerization, such as an alkylidene group. Specific examples thereof include 5-ethylidene-2-norbornene (ENB), 5-propylidene-2-norbornene, 5-butylidene-2-norbornene and the like. Of these, 5-ethylidene-2-norbornene (ENB) is preferable. Other examples of the non-conjugated polyene having only one polymerizable carbon-carbon double bond in one molecule include 2-methyl-2,5-norbornadiene, 2-ethyl-2,5-norbornadiene and the like. These non-conjugated polyenes having only one polymerizable carbon-carbon double bond in one molecule are used singly, or two or more kinds are used in combination.

Of the aforementioned carbon-carbon double bonds, specific examples of the non-conjugated polyene having two polymerizable carbon-carbon double bonds in one molecule include 5-alkenyl-2-norbornenes such as 5-vinyl-2-norbornene (VNB), 5-allyl-2-norbornene; alicyclic polyenes such as 2,5-norbornadiene, dicyclopentadiene (DCPD), tetracyclo[4,4,0,12.5,17.10]deca-3,8-diene; and α,ω-dienes such as 1,7-octadiene, 1,9-decadiene. Of these, preferably used are 5-vinyl-2-norbornene (VNB), dicyclopentadiene, 2,5-norbornadiene, 1,7-octadiene and 1,9-decadiene, and particularly preferably used is 5-vinyl-2-norbornene (VNB).

Specific examples of the ethylene/α-olefin/non-conjugated polyene copolymer include an ethylene/propylene/4,8-dimethyl-1,4,8-decatriene (DMDT) copolymer, an ethylene/propylene/5-vinyl-2-norbornene (VNB) copolymer, an ethylene/propylene/5-ethylidene-2-norbornene (ENB) copolymer, an ethylene/propylene/dicyclopentadiene copolymer, an ethylene/propylene/4,8-dimethyl-1,4,8-decatriene (DMDT)/5-vinyl-2-norbornene (VNB) tetrapolymer, an ethylene/propylene/5-butylidene-2-norbornene/5-vinyl-2-norbornene (VNB) tetrapolymer, an ethylene/propylene/5-ethylidene-2-norbornene (ENB)/5-vinyl-2-norbornene (VNB) tetrapolymer and the like. The ethylene/α-olefin/non-conjugated polyene copolymer may be either a random copolymer or a block copolymer, but is preferably a random copolymer from the viewpoint of flexibility.

Hereinafter, the requirements a1) to a5) will be described.
(Requirement a1))

The shore A hardness of the ethylene/α-olefin copolymer is from 60 to 85, preferably from 60 to 83, and more preferably from 65 to 80 as measured in accordance with ASTM D2240. The shore A hardness of the ethylene/α-olefin copolymer may be adjusted by controlling the content ratio of ethylene units and the density of the ethylene/α-olefin copolymer to the numerical ranges to be described later. In other words, in case of an ethylene/α-olefin copolymer with high content ratio of ethylene units and high density, the shore A hardness is increased. On the other hand, in case of an ethylene/α-olefin copolymer with low content ratio of ethylene units and low density, the shore A hardness is lowered.

In the case where the shore A hardness is less than 60, the crystallization speed of the ethylene/α-olefin copolymer is slowed down. The sheet becomes sticky and is thus blocked, so that feeding property of the sheet tends to be worsened. Furthermore, the crosslinking becomes insufficient, so that there is the risk of lowering heat resistance. In addition, in the extrusion molding, the sheet extruded from an extruder is sticky, so that it is hard to peel off the attached material at a first chill roll and it is hard to obtain a sheet of an encapsulating material for solar cell. In addition, in calender molding, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness.

On the other hand, in the case where the shore A hardness exceeds 85, crystallinity is high so that transparency tends to be lowered. Also, the flexibility is lowered, so that cells as a solar cell element are cracked during lamination molding of a solar cell module or thin film electrodes are cracked in some cases. Furthermore, in the extrusion molding, it is hard to carry out extrusion molding at a low temperature, so that it is necessary to carry out extrusion molding at a high temperature, for example, equal to or more than 130 degrees centigrade. When organic peroxide is kneaded into the ethylene/α-olefin copolymer, a crosslinking reaction proceeds in an extruder and a gelatinous foreign substance is generated on the sheet of an encapsulating material for solar cell, so that the appearance of the sheet tends to be worsened. The intrusion property of the ethylene/α-olefin copolymer into the bank during the calender molding is lowered. In addition, in the calender molding, clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

(Requirement a2))

The ethylene/α-olefin copolymer constituting one aspect of the encapsulating material for solar cell of the present invention, the melt flow rate (MFR) of the ethylene/α-olefin copolymer is from 2 to 50 g/10 minutes, preferably from 2 to 45 g/10 minutes, and further preferably from 2.5 to 40 g/10 minutes as measured under the conditions of a temperature of 190 degrees centigrade and a load of 2.16 kg in accordance with ASTM D1238. MFR of the ethylene/α-olefin copolymer can be adjusted by controlling the polymerization temperature and polymerization pressure during the polymerization reaction to be described later, and the molar fraction of the monomer concentration of ethylene and α-olefin to hydrogen concentration in the polymerization system.

If the MFR is 2 g/10 minutes or more, the elastic modulus of the resin composition containing the ethylene/α-olefin copolymer becomes moderate. Also, if the MFR is less than 50 g/10 minutes, the flowability of the resin composition containing the ethylene/α-olefin copolymer becomes moderate. Therefore, by carrying out the melt flow rate (MFR) of the ethylene/α-olefin copolymer in 2 g to 50 g/10 minutes, sheet-ization becomes easy.

(Requirement a2)-1))

The ethylene/α-olefin copolymer constituting one aspect of the encapsulating material for solar cell of the present invention, the melt flow rate (MFR) of the ethylene/α-olefin copolymer is from 10 to 50 g/10 minutes, preferably from 10 to 45 g/10 minutes, and more preferably from 10 to 40 g/10 minutes as measured under the conditions of a temperature of 190 degrees centigrade and a load of 2.16 kg in accordance with ASTM D1238. The above range is preferable range during obtain by extrusion molding an encapsulating material for solar cell of the present invention.

In the case where MFR is less than 10 g/10 minutes, the flowability of the resin composition containing an ethylene/α-olefin copolymer is reduced, so that the productivity at the time of sheet extrusion molding is lowered. Furthermore, scorch of the resin composition becomes more likely to take place, thus facilitating gelation. This may increase the extruder's torque, which makes it difficult to carry out sheet molding in some cases. Even when a sheet is obtained, gels generated in the extruder may create irregularities on the sheet surface which deteriorate the appearance in some cases. Moreover, application of a voltage causes cracks around gels inside the sheet, thus reducing the dielectric breakdown resistance. Furthermore, moisture permeation becomes likely to occur at the gel interface, thus moisture permeability degrade. Irregularities formed on the sheet surface reduce its adhesion to glass, a cell, an electrode and a backsheet during the lamination process of a solar cell module, thus resulting in poor adhesion.

In the case where MFR exceeds 50 g/10 minutes, the resin composition is attached to the surface of the chill roll or other member due to low molecular weight, thus making it difficult to form a sheet having a uniform thickness due to the necessity of removing the attached material. Moreover, since elastic modulus is low and the resin composition is not chewy, it tends to be difficult to form a thick sheet having a thickness of equal to or more than 0.3 mm. Furthermore, crosslinking properties (particularly crosslinking rate) at the time of lamination molding of a solar cell module are lowered, so that a crosslinked body is not fully obtained and heat resistance tends to be lowered.

(Requirement a2)-2))

The ethylene/α-olefin copolymer constituting another aspect of the encapsulating material for solar cell of the present invention, the melt flow rate (MFR) of the ethylene/α-olefin copolymer is more than 2 g/10 minutes and less than 10 g/10 minutes. Preferably from 2 to 9.5 g/10 minutes, and more preferably from 2.5 to 9.5 g/10 minutes as measured under the conditions of a temperature of 190 degrees centigrade and a load of 2.16 kg in accordance with ASTM D1238. The above range is preferable range during obtain by calender molding an encapsulating material for solar cell of the present invention.

If the MFR is 2 g/10 minutes or more, the elastic modulus of the resin composition containing the ethylene/α-olefin copolymer becomes moderate. For this reason, during calender molding, more kneading is not required in order to ensure homogeneous dispersion of various additives in the resin composition, and therefore the productivity is enhanced. Furthermore, it is possible to obtain a thin sheet, and thickness control also becomes easy. Meanwhile, when the MFR is equal to or more than 2 g/10 min, scorch characteristics of the resin composition become proper and the resin composition is hardly gelated. Accordingly, it is possible to prevent the generation of irregularities on the surface of a sheet due to the presence of a gel-like substance, and therefore to prevent deterioration of sheet appearance. Incidentally, application of voltage to sheet containing a gel-like substance causes cracking around the gel-like substance inside the sheet, and therefore the dielectric breakdown resistance decreases. Furthermore, moisture permeation easily occurs at the interface of the gel-like substance, and therefore moisture permeability is increased. Accordingly, it is possible to obtain a sheet excellent in dielectric breakdown resistance and moisture permeability by preventing gelation. Furthermore, it is possible to prevent the deterioration of adhesion to glass, solar cell elements, electrodes, and backsheet during the lamination process of a solar cell module, resulting in insufficient adhesion and cracking in the solar cell elements due to the generation of irregularities on the sheet surface.

When the MFR is less than 10 g/10 min, the molecular weight and modulus of elasticity suitable for calender molding are achieved. Thus, a sheet having a uniform thickness can be formed because adhesion of the resin composition to the calender roll surface can be prevented, and it is easy to peel off the attached material. Furthermore, it is possible to prevent such a phenomenon that the melt may not wrap around only one calender roll but wraps around both the two calender rolls so as to split, and it is also possible to prevent such a phenomenon that the melt may fall from the calender roll due to its weight.

(Requirement a3))

The total of structural units derived from ethylene and units derived from α-olefin having 3 to 20 carbon atoms contained in the ethylene/α-olefin copolymer is 100 mol %. The content ratio of structural units derived from ethylene is from 80 to 90 mol % and units derived from α-olefin having 3 to 20 carbon atoms (hereinafter also referred to as the α-olefin units) is preferably from 10 to 20 mol %, more preferably from 12 to 20 mol %, and further preferably from 13 to 18 mol %. In the case where the content ratio of the α-olefin units is less than 10 mol %, crystallization is high so that transparency tends to be lowered. In addition, the flexibility is lowered, so that cells as a solar cell element are cracked during lamination molding of a solar cell module or thin film electrodes are cracked in some cases. Furthermore, in the extrusion molding, it is hard to carry out extrusion molding at a low temperature, so that it is necessary to carry out extrusion molding at a high temperature, for example, equal to or more than 130 degrees centigrade. When organic peroxide is kneaded into the ethylene/α-olefin copolymer, a crosslinking reaction proceeds in an extruder and a gelatinous foreign substance is generated on the sheet of an encapsulating material for solar cell, so that the appearance of the sheet tends to be worsened. In addition, in the calender molding, furthermore, during calender molding, a failure in intrusion of the ethylene/α-olefin copolymer into a resin reservoir (hereinafter, referred to as a bank) between calender rolls occurs or clinging to the calender rolls get worse. For this reason, it is necessary to set a temperature for calender molding to a high temperature, for example, 100° C. or more. Meanwhile, if the temperature for calender molding is high, in a case of kneading organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

On the other hand, in the case where the content ratio of the α-olefin units exceeds 20 mol %, the crystallization rate of the ethylene/α-olefin copolymer is slowed down. The sheet becomes sticky and is thus blocked, so that feeding property of the sheet tends to be worsened. Furthermore, the crosslinking becomes insufficient, so that there is the risk of lowering heat resistance. In addition, in the extrusion molding, the sheet extruded from an extruder is sticky, so that it is hard to peel off the attached material at a first chill roll and it is hard to obtain a sheet of an encapsulating material for solar cell.

In case of calender molding, the sheet is easily attached to the surface of calender rolls during calender molding. Thus, release of the sheet from the calender rolls may become difficult, making it difficult to provide a uniform-thick sheet of the encapsulating material for solar cell.

(Requirement a4))

The density of the ethylene/α-olefin copolymer is from 0.865 to 0.884 g/cm$^3$, preferably from 0.865 to 0.880 g/cm$^3$ as measured in accordance with ASTM D1505. The density of the ethylene/α-olefin copolymer may be adjusted by a balance between the content ratio of ethylene units and the content ratio of α-olefin units. Namely, when the content ratio of ethylene units is increased, crystallinity is increased. Thus, an ethylene/α-olefin copolymer with high density can be obtained. On the other hand, when the content ratio of ethylene units is decreased, crystallinity is lowered. Thus, an ethylene/α-olefin copolymer with low density can be obtained.

In the case where the density of the ethylene/α-olefin copolymer exceeds 0.884 g/cm$^3$, crystallinity is increased so that transparency tends to be lowered. In addition, the flexibility is lowered, so that cells as a solar cell element are cracked during lamination molding of a solar cell module or thin film electrodes are cracked in some cases. Furthermore, it is hard to carry out extrusion molding at a low temperature, so that it is necessary to carry out extrusion molding at a high temperature, for example, equal to or more than 130 degrees centigrade. When organic peroxide is kneaded into the ethylene/α-olefin copolymer, a crosslinking reaction proceeds in an extruder and a gelatinous foreign substance is generated on the sheet of an encapsulating material for solar cell, so that the appearance of the sheet tends to be worsened. In addition, in the calender molding, the intrusion property of the ethylene/α-olefin copolymer into the bank during the calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

On the other hand, in the case where the density of the ethylene/α-olefin copolymer is less than 0.865 g/cm$^3$, the crystallization rate of the ethylene/α-olefin copolymer is slowed down. The sheet becomes sticky and is thus blocked, so that feeding property of the sheet tends to be worsened. In addition, the crosslinking becomes insufficient, so that there is the risk of lowering heat resistance. Furthermore, in the extrusion molding, the sheet extruded from an extruder is sticky, so that it is hard to peel off the attached material at a first chill roll and it is hard to obtain a sheet of an encapsulating material for solar cell.

In case of calender molding, since a resin composition is sticky, during calender molding, it becomes easy for a sheet to stick to the surfaces of the calender rolls. Thus, release of the sheet from the calender rolls may become difficult, making it difficult to provide a uniform-thick sheet of the encapsulating material for solar cell.

(Requirement a5))

When the ethylene/α-olefin copolymer is an ethylene/α-olefin/non-conjugated polyene copolymer, the total amount of respective constituent units derived from ethylene, α-olefin having 3 to 20 carbon atoms and non-conjugated polyene copolymer, to be contained in the ethylene/α-olefin/non-conjugated polyene copolymer, is 100 mol %. It is preferable that the proportion of the constituent unit derived from ethylene is from 80 to 90 mol %, the proportion of the constituent unit derived from α-olefin having 3 to 20 carbon atoms (hereinafter referred to as the α-olefin unit) is from 9.99 to 19.99 mol %, and the proportion of the constituent unit derived from the non-conjugated polyene is from 0.01 to 5.0 mol %. The proportion of the α-olefin unit is more preferably from 11 to 19.99 mol %, and further preferably from 12.5 to 19 mol %. In the case where the content ratio of the α-olefin units is less than 9.99 mol %, crystallization is high so that transparency tends to be lowered. In addition, the flexibility is lowered, so that cells as a solar cell element are cracked during lamination molding of a solar cell module or thin film electrodes are cracked in some cases. Furthermore, in the extrusion molding, it is hard to carry out extrusion molding at a low temperature, so that it is necessary to carry out extrusion molding at a high temperature, for example, equal to or more than 130 degrees centigrade. When organic peroxide is kneaded into the ethylene/α-olefin copolymer, a crosslinking reaction proceeds in an extruder and a gelatinous foreign substance is generated on the sheet of an encapsulating material for solar cell, so that the appearance of the sheet tends to be worsened. In addition, in the calender molding, furthermore, during calender molding, a failure in intrusion of the ethylene/α-olefin/non-conjugated polyene copolymer into a resin reservoir (hereinafter, referred to as a bank) between calender rolls occurs or clinging to the calender rolls get worse. For this reason, it is necessary to set a temperature for calender molding to a high temperature, for example, 100° C. or more. Meanwhile, if the temperature for calender molding is high, in a case of kneading organic peroxide into the ethylene/α-olefin/non-conjugated polyene copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

On the other hand, in the case where the content ratio of the α-olefin units exceeds 19.99 mol %, the crystallization rate of the ethylene/α-olefin/non-conjugated polyene copolymer is slowed down. The sheet becomes sticky and is thus blocked, so that feeding property of the sheet tends to be worsened. Furthermore, the crosslinking becomes insufficient, so that there is the risk of lowering heat resistance. In addition, in the extrusion molding, the sheet extruded from an extruder is sticky, so that it is hard to peel off the attached material at a first chill roll and it is hard to obtain a sheet of an encapsulating material for solar cell.

In case of calender molding, the sheet is easily attached to the surface of calender rolls during calender molding. Thus, release of the sheet from the calender rolls may become difficult, making it difficult to provide a uniform-thick sheet of the encapsulating material for solar cell.

The ratio of structural units derived from non-conjugated polyene contained in the ethylene/α-olefin/non-conjugated polyene copolymer (hereinafter also referred to as the non-conjugated polyene units) is from 0.01 to 5.0 mol %, preferably from 0.01 to 4.5 mol %, more preferably from 0.05 to 4.0 mol %. In the case where the content ratio of the non-conjugated polyene units is less than 0.01 mol %, the crosslinking properties tends to be lowered. On the other hand, in the case where the content ratio of the non-conjugated polyene units exceeds 5.0 mol %, a crosslinking reaction proceeds during calender molding or extrusion molding and a gelatinous foreign substance is generated on the sheet of an encapsulating material for solar cell, so that the appearance of the sheet tends to be worsened.

(Content of Aluminum Element (Amount of Residue))

The content of aluminum element (hereinafter referred to as Al) (amount of residue) contained in the ethylene/α-olefin copolymer is preferably from 10 to 500 ppm, more preferably from 10 to 400 ppm, and further preferably from 50 to 300 ppm. In the case where the content of the Al is less than 10 ppm, crosslinking properties become insufficient, thus resulting in lowered heat resistance and less adhesion. In addition, insufficient crosslinking properties, the electrical properties at a high temperature, for example, 100 degrees centigrade tend to be lowered.

This is probably because the molecular motion of the ethylene.α-olefin copolymer according to the crosslinking cannot be suppressed, it is not possible to suppress the movement of charge due to molecular motion and migration of the additive at high temperature.

On the other hand, in the case where the Al content exceeds 500 ppm, in the extrusion molding, a crosslinking reaction proceeds in an extruder and a gelatinous foreign substance is generated on the sheet of an encapsulating material for solar cell, so that the appearance of the sheet tends to be worsened. In the calendar molding, a crosslinking reaction proceeds during calender molding and a gelatinous foreign substance is generated on the sheet of an encapsulating material for solar cell, so that the appearance of the sheet tends to be worsened.

Trend as described above is assumed because a small amount of Al contained in the ethylene/α-olefin copolymer promotes the activation of a crosslinking agent, and therefore the efficiency of a crosslinking reaction of the ethylene/α-olefin copolymer and a graft reaction between the ethylenically unsaturated silane compound and the ethylene/α-olefin copolymer is enhanced.

As described above, as a method of controlling the aluminum element contained in the ethylene/α-olefin copolymer, for example, the aluminum element contained in the ethylene/α-olefin copolymer may be controlled by adjusting the concentration in the production step of an organic aluminumoxy compound (II-1) and an organic aluminum compound (II-2) described in the method for producing an ethylene/α-olefin copolymer to be described later, or the polymerization activity of the metallocene compound under the production conditions of the ethylene/α-olefin copolymer.

(B Value)

The B value of the ethylene/α-olefin copolymer determined from the $^{13}$C-NMR spectrum and the following equation (1) is preferably from 0.9 to 1.5, more preferably from 0.9 to 1.3, further preferably from 0.95 to 1.3, particularly preferably from 0.95 to 1.2, and the most preferably from 1.0 to 1.2. The B value can be adjusted by changing a polymerization catalyst during polymerization of the ethylene/α-olefin copolymer. More specifically, by the use of a metallocene compound to be described later, it is possible to obtain an ethylene/α-olefin copolymer with the B value in the above numerical range:

$$B\ Value = [P_{OE}]/(2 \times [P_o] \times [P_E]) \quad (1)$$

wherein, in the equation (1), $[P_E]$ represents the molar fraction of structural units derived from ethylene contained in the ethylene/α-olefin copolymer; $[P_o]$ represents the molar fraction of structural units derived from α-olefin having 3 to 20 carbon atoms contained in the ethylene/α-olefin copolymer; and $[P_{OE}]$ represents the molar fraction of an α-olefin/ethylene chain contained in the total dyad chain.

The B value is an index which represents the distribution of the ethylene units and α-olefin units in the ethylene/α-olefin copolymer. The B value is determined according to the procedures reported by J. C. Randall (Macromolecules, 15, 353 (1982)) and J. Ray (Macromolecules, 10, 773 (1977)).

A higher B value indicates that the copolymer contains less ethylene units or less block chain units of the α-olefin copolymer, has a more uniform distribution of ethylene units and α-olefin units, and has a narrower composition distribution of a copolymer rubber. It should be noted that, the B value of less than 0.9 indicates that the ethylene/α-olefin copolymer has a wider composition distribution. Particularly, block chain units of ethylene are increased, crystallization is high so that transparency tends to be lowered. In addition, the flexibility is lowered, so that a solar cell element are cracked during lamination molding of a solar cell module or thin film electrodes are cracked in some cases. In the extrusion molding, extrusion molding at a low temperature becomes difficult, so that it is necessary to carry out extrusion molding at a high temperature, for example, equal to or more than 130 degrees centigrade. When organic peroxide is kneaded into the ethylene/α-olefin copolymer, a crosslinking reaction proceeds in an extruder and a gelatinous foreign substance is generated on the sheet of an encapsulating material for solar cell, so that the appearance of the sheet tends to be worsened. In the calender molding, the intrusion property of the ethylene/α-olefin copolymer into the bank during the calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

The B value of the ethylene/α-olefin/non-conjugated polyene copolymer in case of becoming the ethylene/α-olefin/non-conjugated polyene copolymer determined from the $^{13}$C-NMR spectrum and the following equation (2) is preferably from 0.9 to 1.3, more preferably from 0.95 to 1.3, further preferably from 0.95 to 1.2.

The B value can be adjusted by changing a polymerization catalyst during polymerization of the ethylene/α-olefin/non-conjugated polyene copolymer. More specifically, it is possible to obtain an ethylene/α-olefin/non-conjugated polyene copolymer having the B value in the aforementioned numerical range by the use of a metallocene compound to be described later. A higher B value indicates that the copolymer contains less ethylene units or less block chain units of the α-olefin copolymer, has a more uniform distribution of ethylene units and α-olefin units and non-conjugated polyene copolymer, and has a narrower composition distribution of an ethylene/α-olefin/non-conjugated polyene copolymer. It should be noted that, the B value of less than 0.9 indicates that the ethylene/α-olefin/non-conjugated polyene copolymer has a wider composition distribution. Particularly, block chain units of ethylene units increase, the degree of crystallinity is high, and transparency is reduced. In addition, the flexibility is lowered, so that a solar cell element are cracked during lamination molding of a solar cell module or thin film electrodes are cracked in some cases. In the extrusion molding, extrusion molding at a low temperature becomes difficult, so that it is necessary to carry out extrusion molding at a high temperature, for example, equal to or more than 130 degrees centigrade. When organic peroxide is kneaded into the ethylene/α-olefin/non-conjugated polyene copolymer, a crosslinking reaction proceeds in an extruder and a gelatinous foreign substance is generated on the sheet of an encapsulating material for solar cell, so that the appearance of the sheet tends to be worsened. In the calender molding, the intrusion property of the ethylene/α-olefin/non-conjugated polyene copolymer into the bank during the calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin/non-conjugated polyene copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

The B value is calculated according to the following equation (2) from the molar fraction of constituent units derived from the respective monomers and a fraction of dyad sequence of ethylene/α-olefin having 3 to 20 carbon atoms.

$$B\ value = ([EX]+2[Y])/\{2[E] \times ([X]+[Y])\} \quad (2)$$

In the equation (2), [E], [α] and [Y] each represent molar fractions of ethylene, α-olefin having 3 to 20 carbon atoms and non-conjugated polyene, and [EX] represents a fraction of dyad sequence of ethylene/α-olefin having 3 to 20 carbon atoms.

When the ethylene/α-olefin having 3 to 20 carbon atoms/non-conjugated polyene copolymer is an ethylene/propylene/ENB copolymer having a structure represented by the following general formula (5) and is an ethylene/propylene/VNB copolymer having a structure represented by the following general formula (6), the B value and composition can be determined according to the following procedure. Meanwhile, in case of an ethylene/propylene/ENB/VNB copolymer, the B value and composition can be obtained by handling ENB and VNB as one kind of the non-conjugated polyene (ENB).

First, NMR integral values of the following 9 kinds were determined. Incidentally, the NMR integral value was obtained by measuring a $^{13}$C-NMR spectrum of the copolymer by the use of an ECX400P type nuclear magnetic resonance device (a product of JEOL Ltd.) under the conditions of a measuring temperature of 120 degrees centigrade, a measuring solvent of orthodichlorobenzene/deuterated benzene (4/1) and the number of integration times of 8000.

(i) αβ, (ii) αγ+αδ, (iii) βγ, (iv) βδ, (v) γδ, (vi) δδ, (vii) 3E, (viii) 3Z, (ix) αα+1Z+5E+5Z+6E+6Z.

Herein, α, β, γ and δ indicate that the methylene signal noted is away from the methine carbon (branch) by 1 bond, 2 bonds, 3 bonds and 4 bonds, respectively. Furthermore, a symbol consisting of a numeral and an English character in the above (vii) to (ix) represents a carbon derived from ENB, and the numeral represents a position in the following general formulae (5) and (6), and the English characters E and Z represent E form and Z form, respectively.

[Chemical Formula 5]

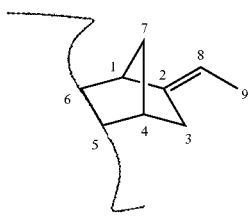

(5)

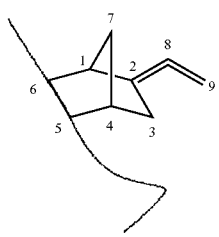

(6)

The above (ii) represents the total of plural peaks of 37 to 39 ppm, the above (vi) represents a numerical value obtained by subtracting peaks of γγ and γδ from the total of plural peaks of 29 to 31 ppm, and the above (ix) adopts the total of plural peaks of 44 to 48 ppm.

Furthermore, αα is calculated as follows.

αα=αα+1Z+5E+5Z+6E+6Z−2×3E−3×3Z=(9)−2×(7)−3×(8)

The dyad sequence fraction is calculated as follows.

PP (propylene/propylene sequence)=αα+αβ/4

PE (propylene/ethylene sequence)=αγ+αδ+αβ/2

EE (ethylene/ethylene sequence)=(βδ+δδ)/2+(γδ+βγ)/4

NE (ENB/ethylene sequence)+NP(ENB/propylene sequence)+NN (ENB/ENB sequence)=(3E+3Z)×2

Therefore, composition is calculated as follows.

[E] (ethylene molar fraction)=(EE+PE/2+3E+3Z)/(PP+PE+EE+3E+3Z)

[X] [α](α-olefin molar fraction)=(PP+PE/2)/(PP+PE+EE+3E+3Z)

[Y] (non-conjugated polyene molar fraction)=(3E+3Z)/(PP+PE+EE+3E+3Z)

The dyad sequence fraction [EX] is calculated as follows.

[EX]=PE/(PP+PE+EE+3E+3Z)

As described above, the B value can be calculated as follows.

B value=([EX]+2[Y])/{2[E]×([X]+[Y])}     (2)

The B value and the dyad fraction can be determined with reference to Seger, M. R. and Maciel, G. E., Anal. Chem. 2004, 76, 5734-5747, J. C. Randall, Macromolecules, 1982, 15, 353, and J. Ray, Macromolecules, 1977, 10, 773.

In the above equation (2), a higher B value indicates that the copolymer contains less α-olefin (polyene) units or less block chain units of the non-conjugated polyene units, has a more uniform distribution of α-olefin(polyene) units and non-conjugated polyene units. On the contrary, a lower B value indicates that the copolymer contains more block chain units and the distribution of non-conjugated polyene-based copolymer is not uniform.

(Intensity Ratio of Tαβ to Tαα)

The intensity ratio of Tαβ to Tαα (Tαβ/Tαα) in the $^{13}$C-NMR spectrum of the ethylene/α-olefin copolymer is preferably equal to or less than 1.5, further preferably equal to or less than 1.2, particularly preferably equal to or less than 1.0, and most preferably less than 0.7. The Tαβ/Tαα can be adjusted by changing a polymerization catalyst during polymerization of the ethylene/α-olefin copolymer. More specifically, by the use of a metallocene compound to be described later, it is possible to obtain an ethylene/α-olefin copolymer with the Tαβ/Tαα in the above numerical range.

The Tαα and Tαβ in the $^{13}$C-NMR spectrum are each a peak intensity of $CH_2$ in the constituent unit derived from α-olefin having equal to or more than 3 carbon atoms. More specifically, they mean peak intensities each of two kinds of $CH_2$ which are different in positions to the tertiary carbon as shown in the following general formula (7).

[Chemical Formula 6]

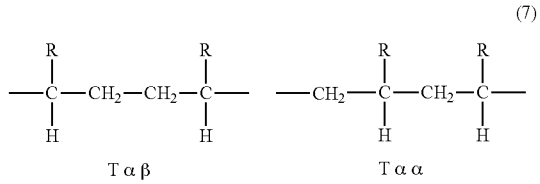

(7)

The Tαβ/Tαα can be determined in the following manner. A $^{13}$C-NMR spectrum of the ethylene/α-olefin copolymer is measured using an NMR measuring apparatus (for example, product name: JEOL-GX270, a product of JEOL Ltd.). The measurement is carried out using a mixed solution of hexachlorobutadiene and d6-benzene (hexachlorobutadiene/d6-benzene=2/1 (volume ratio)) with a sample concentration adjusted to 5 weight %, under the conditions of 67.8 MHz, 25 degrees centigrade and d6-benzene (128 ppm) basis. The $^{13}$C-NMR spectrum thus measured is analyzed in accordance with proposals of Lindemann Adams (Analysis Chemistry, 43, p 1245 (1971)) and J. C. Randall (Review Macromolecular Chemistry Physics, C29, 201 (1989)) to determine a Tαβ/Tαα intensity ratio.

The intensity ratio of Tαβ to Tαα (Tαβ/Tαα) in the $^{13}$C-NMR of the ethylene/α-olefin copolymer represents the coordination state of α-olefin to a polymerization catalyst during the polymerization reaction. When the α-olefin is coordinated to a polymerization catalyst in a Tαβ type, substituent groups of α-olefin hinder the polymerization growth reaction of the polymer chain, and growth of the low molecular weight component tends to be promoted. The sheet becomes sticky and is thus blocked, so that feeding property of the sheet tends to be worsened. Furthermore, since the low molecular weight component is bled on the sheet surface, adhesion is hindered and adhesiveness is lowered.

(Molecular Weight Distribution (Mw/Mn))

For the ethylene/α-olefin copolymer, the molecular weight distribution (Mw/Mn) represented by a ratio of the weight average molecular weight (Mw) to the number average molecular weight (Mn) is preferably in the range of 1.2 to 3.5, more preferably in the range of 1.7 to 3.0, further preferably in the range of 1.7 to 2.7, and particularly preferably in the range of 1.9 to 2.4, as measured by gel permeation chromatography (GPC). The molecular weight distribution (Mw/Mn) of the ethylene/α-olefin copolymer can be adjusted by using a metallocene compound to be described later during polymerization.

In order to make Mw/Mn less than 1.2, the catalyst activity for living polymerization of the ethylene/α-olefin copolymer is not achieved. Or, it is necessary to separate the low molecular weight component and the high molecular weight component of the ethylene/α-olefin copolymer obtained in a polymerization method known in the art, so that the production costs are increased. The extrusion molding temperature width is also narrowed and the discharge amount at an extruder is hardly uniformed either, so that a sheet having a uniform thickness is hardly formed and the sheet tends to be hardly molded. Meanwhile, the calender molding temperature width is also narrowed, so that a sheet having a uniform thickness is hardly formed and the sheet tends to be hardly molded.

On the other hand, in the case where Mw/Mn exceeds 3.5, since the low molecular weight component is increased, the sheet becomes sticky and is thus blocked. So, feeding property of the sheet tends to be worsened. Furthermore, it has been known that, in general, when the molecular weight distribution (Mw/Mn) becomes wide, the composition distribution also becomes wide. The sheet becomes sticky and is thus blocked, so that feeding property of the sheet tends to be worsened. In addition, since the low molecular weight component is bled on the sheet surface, adhesion is hindered and adhesiveness is lowered. In case of calender molding, the sheet is easily attached to the surface of calender rolls during calender molding. Thus, release of the sheet from the calender rolls may become difficult, making it difficult to provide a uniform-thick sheet of the encapsulating material for solar cell. Moreover, the melt may not wrap around only one calender roll but wraps around both the two calender rolls so as to split in some cases.

In the present specification, the ratio (Mw/Mn) of the weight average molecular weight (Mw) to the number average molecular weight (Mn) is measured using gel permeation chromatograph (product name: Alliance GPC-2000 manufactured by Waters Co., Ltd.) in the following manner. Separation columns are two TSKgel GMH6-HT columns and two TSKgel GMH6-HTL columns. The columns have an internal diameter of 7.5 mm and a length of 300 mm. The column temperature is 140 degrees centigrade. The mobile phase is o-dichlorobenzene (a product of Wako Pure Chemical Industries, Ltd.), and 0.025 weight % of BHT (a product of Takeda Pharmaceutical Co., Ltd.) is used therewith as an antioxidant. The mobile phase is passed at a rate of 1.0 ml/minute. The sample concentration is 15 mg/10 ml and the amount of sample injected is 500 μl. A differential refractometer is used as a detector. For molecular weights of Mw≤1,000 and Mw≥4×10$^6$, polystyrenes manufactured by Tosoh Corporation are used as standards. For molecular weights of 1,000≤Mw≤4×10$^6$, polystyrenes manufactured by Pressure Chemical Co., Ltd. are used as standards. The molecular weight is a value in terms of the ethylene/α-olefin copolymer for respective α-olefins using a universal calibration curve.

(The Content Ratio of Chlorine Ion)

The content ratio of chlorine ion of the ethylene/α-olefin copolymer is preferably equal to or less than 2 ppm, further preferably equal to or less than 1.5 ppm, and particularly preferably equal to or less than 1.2 ppm, as detected from an extract subjected to solid-phase extraction by ion chromatography. The content ratio of chlorine ion can be adjusted by controlling the structure of a metallocene compound and polymerization conditions to be described later. That is, the amount of catalyst residue in the ethylene/α-olefin copolymer is reduced by increasing the polymerization activity of the catalyst, so that it is possible to obtain an ethylene/α-olefin copolymer with the content ratio of chlorine ion in the above numerical range.

The content ratio of chlorine ion in the ethylene/α-olefin copolymer can be measured with an ion chromatograph apparatus (product name: ICS-2000 manufactured by Dionex Corporation) using an extract obtained by accurately weighing about 10 g of the ethylene/α-olefin copolymer in a glass container that is sterilized and washed using an autoclave or the like, adding 100 ml of ultra pure water for tightly sealing the container, and then carrying out ultrasonic wave (38 kHz) extraction at a normal temperature for 30 minutes.

In the case where the content ratio of chlorine ion in the ethylene/α-olefin copolymer exceeds 2 ppm, electrodes consisting of silver or the like are corroded, so that long-term reliability of the solar cell module is lowered in some cases. It is possible to obtain an ethylene/α-olefin copolymer substantially free from chlorine ion by the use of a metallocene compound without containing a chlorine atom.

(An Extracted Amount in Methyl Acetate)

The extracted amount of the ethylene/α-olefin copolymer in methyl acetate is preferably equal to or less than 5.0 weight %, more preferably equal to or less than 4.0 weight %, further preferably equal to or less than 3.5 weight %, and particularly preferably equal to or less than 2.0 weight %. A large amount of extraction in methyl acetate means that a lot of low molecular weight component is contained in the ethylene/α-olefin copolymer, and the molecular weight distribution or the composition distribution is broad. Therefore, it is possible to obtain an ethylene/α-olefin copolymer with a small amount of extraction in methyl acetate by controlling the polymerization conditions using a metallocene compound to be described later.

For example, if the metallocene compound with reduced polymerization activity by shortening the polymerization time in a polymerization reactor is taken out of the polymerization system, generation of the low molecular weight component is suppressed. In the case where the extracted amount in methyl acetate by the Soxhlet extraction method exceeds 5.0 weight %, the sheet becomes sticky and is thus blocked, so that feeding property of the sheet tends to be worsened. It has been known that, in general, when the molecular weight distribution (Mw/Mn) becomes wide, the composition distribution also becomes wide. The sheet becomes sticky and is thus blocked, so that feeding property of the sheet tends to be worsened. Furthermore, since the low molecular weight component is bled on the sheet surface, adhesion is hindered and adhesiveness is lowered. In case of calender molding, the sheet is easily attached to the surface of calender rolls during calender molding. Thus, release of the sheet from the calender rolls may become difficult, making it difficult to provide a uniform-thick sheet of the solar cell sealing material. The extracted amount of the copolymer in methyl acetate is calculated from the weight differences in the ethylene/α-olefin copolymer before and after extraction or the amount of residue by volatilizing an extraction solvent by accurately weighing about 10 g of the ethylene/α-olefin copolymer, using an organic solvent as a poor solvent of the ethylene/α-olefin copolymer having a low boiling point such as methyl acetate, methyl ethyl ketone or the like, and carrying out Soxhlet extraction at a temperature of equal to or more than the boiling point of each solvent.

(Melting Peak)

The melting peak of the ethylene/α-olefin copolymer is present preferably in the range of 30 to 90 degrees centigrade, further preferably in the range of 33 to 90 degrees centigrade, and particularly preferably in the range of 33 to 88 degrees centigrade, as measured by differential scanning calorimetry (DSC). In the case where the melting peak exceeds 90 degrees centigrade, the degree of crystallinity is high and the flexibility of the obtained encapsulating material for solar cell is low, so that cells are cracked during lamination molding of a solar cell module or thin film electrodes are cracked in some cases. Furthermore, in the extrusion molding, it is hard to carry out extrusion molding at a low temperature, so that it is necessary to carry out extrusion molding at a high temperature, for example, equal to or more than 130 degrees centigrade. When organic peroxide is kneaded into the ethylene/α-olefin copolymer, a crosslinking reaction proceeds in an extruder and a gelatinous foreign substance is generated on the sheet of an encapsulating material for solar cell, so that the appearance of the sheet tends to be worsened. In addition, in the calender molding, furthermore, during calender molding, a failure in intrusion of the ethylene/α-olefin copolymer into a resin reservoir (hereinafter, referred to as a bank) between calender rolls occurs or clinging to the calender rolls get worse. For this reason, it is necessary to set a temperature for calender molding to a high temperature, for example, 100° C. or more. Meanwhile, if the temperature for calender molding is high, in a case of kneading organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced.

In the case where the melting peak is less than 30 degrees centigrade, the flexibility of the resin composition is excessively increased, so that it is hard to obtain a sheet of an encapsulating material for solar cell by extrusion molding in some cases. Also, the sheet becomes sticky and is thus blocked, so that feeding property of the sheet tends to be worsened. Also, the crosslinking becomes insufficient, so that there is the risk of lowering heat resistance. In case of extrusion molding, the sheet extruded from an extruder is sticky, so that it is hard to peel off the attached material at a first chill roll and it is hard to obtain a sheet of an encapsulating material for solar cell. In addition, in the calender molding, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness.

(Method for Producing Ethylene/α-Olefin Copolymer)

A method for producing is not particularly limited, the ethylene/α-olefin copolymer can be produced using as a catalyst with the compound known in the art such as titanium compounds, vanadium compounds or metallocene compounds. The metallocene compound is most preferred among them. As the metallocene compound, there may be used metallocene compounds as disclosed, for example, in Japanese Laid-open Patent Publication No. 2006-077261, Japanese Laid-open Patent Publication No. 2008-231265, Japanese Laid-open Patent Publication No. 2005-314680 and the like. However, metallocene compounds which have different structures than those of the metallocene compounds disclosed in these Patent Documents may also be used, or two or more metallocene compounds may be used in combination.

Preferable examples of the polymerization reaction using a metallocene compound include the following aspects.

There are provided one or more monomers selected from ethylene, α-olefin and the like in the presence of an olefin polymerization catalyst composed of a metallocene compound (I) known in the art, and at least one compound (II) selected from the group consisting of an organic aluminumoxy compound (II-1), a compound (II-2) that forms ion pairs by reaction with the aforementioned metallocene compound (I) and an organic aluminum compound (II-3) (also referred to as the catalytic promoter).

As the organic aluminumoxy compound (II-1), the compound (II-2) that forms ion pairs by reaction with the aforementioned metallocene compound (I) and the organic aluminum compound (II-3), there may be used metallocene compounds as disclosed, for example, in Japanese Laid-open Patent Publication No. 2006-077261, Japanese Laid-open Patent Publication No. 2008-231265, Japanese Laid-open Patent Publication No. 2005-314680 and the like. However, metallocene compounds which have different structures than those of the metallocene compounds disclosed in these Patent Documents may also be used. These compounds may be individually charged into a polymerization atmosphere or may be previously contacted with one another before being charged into the polymerization atmosphere. Furthermore, the metallocene compounds may be loaded on an inorganic oxide microparticle carrier such as that disclosed in Japanese Laid-open Patent Publication No. 2005-314680.

The ethylene/α-olefin copolymer can be polymerized by gas-phase polymerization known in the art or by liquid-phase polymerization such as slurry polymerization, solution polymerization or the like. Liquid-phase polymerization such as solution polymerization or the like is preferably. When an ethylene/α-olefin copolymer is produced by copolymerizing ethylene with α-olefin having 3 to 20 carbon atoms using the aforementioned metallocene compound, the metallocene compound (I) is usually used in an amount of $10^{-9}$ to $10^{-1}$ mol and preferably $10^{-8}$ to $10^{-2}$ mol, per 1 L reaction volume.

The compound (II-1) is used in an amount such that the molar ratio of the compound (II-1) to the total transition metal atoms (M) in the metallocene compound (I), [(II-1)/M], usually ranges from 1 to 10,000 and preferably from 10 to 5,000. The compound (II-2) is used in an amount such that the molar ratio of the compound (II-2) to the total transition metal atoms (M) in the metallocene compound (I), [(II-2)/ M], usually ranges from 0.5 to 50 and preferably from 1 to 20. The compound (II-3) is used in an amount of usually 0 to 5 mmol and preferably about 0 to 2 mmol, per 1 L polymerization reaction volume.

In the case of solution polymerization, an ethylene/α-olefin copolymer with high comonomer content, a narrow composition distribution and a narrow molecular weight distribution can be efficiently produced by copolymerization of ethylene with α-olefin having 3 to 20 carbon atoms in the presence of the aforementioned metallocene compound. As to the charging molar ratio of ethylene to α-olefin having 3 to 20 carbon atoms (by mol), ethylene/α-olefin is usually from 10/90 to 99.9/0.1, preferably from 30/70 to 99.9/0.1, and further preferably from 50/50 to 99.9/0.1. In addition, in the case of the ethylene/α-olefin/non-conjugated polyene copolymer, as to the charging molar ratio of ethylene to α-olefin and non-conjugated polyene having 3 to 20 carbon atoms (by mol), ethylene/α-olefin/non-conjugated polyene is usually from 10/90/1 to 99.9/0.1/0.01, preferably from 30/70/1 to 99.9/0.1/0.01, and further preferably from 50/50/1 to 99.9/0.1/0.01.

Examples of the α-olefin having 3 to 20 carbon atoms include straight-chain or branched α-olefins, such as, propylene, 1-butene, 2-butene, 1-pentene, 3-methyl-1-butene, 1-hexene, 4-methyl-1-pentene, 3-methyl-1-pentene, 1-octene, 1-decene, 1-dodecene and the like. Also, examples of α-olefin which is used in the solution polymerization include polar group-containing olefins. Examples of the polar group-containing olefin include α,β-unsaturated carboxylic acids such as acrylic acid, methacrylic acid, fumaric acid, maleic anhydride, and metal salts such as sodium salts thereof; α,β-unsaturated carboxylic acid esters such as methyl acrylate, ethyl acrylate, n-propyl acrylate, methyl methacrylate, ethyl methacrylate and the like; vinyl esters such as vinyl acetate, vinyl propionate and the like; and unsaturated glycidyl esters such as glycidyl acrylate, glycidyl methacrylate and the like. High-temperature solution polymerization can also be proceeded under the coexistence of a vinyl cyclohexane, diene, or polyene; an aromatic vinyl compound, for example, styrenes such as styrene, o-methylstyrene, m-methylstyrene, p-methylstyrene, o,p-dimethylstyrene, methoxystyrene, vinyl benzoate, vinyl methyl benzoate, vinyl benzyl acetate, hydroxystyrene, p-chlorostyrene, divinylbenzene and the like; 3-phenylpropylene, 4-phenylpropylene, α-methylstyrene and the like in a reaction system. Among the aforementioned α-olefins, preferably used are propylene, 1-butene, 1-hexene, 4-methyl-1-pentene and 1-octene. In the solution polymerization, cyclic olefins having 3 to 20 carbon atoms such as cyclopentene, cycloheptene, norbornene, 5-methyl-2-norbornene, 5-ethylidene-2-norbornene, 5-vinyl-2-norbornene and the like may be used in combination.

"Solution polymerization" is a generic term used to refer to a method of polymerization in which a polymer is dissolved in an inert hydrocarbon solvent to be described later. The polymerization temperature in the solution polymerization is usually from 0 to 200 degrees centigrade, preferably from 20 to 190 degrees centigrade, and further preferably from 40 to 180 degrees centigrade. When the polymerization temperature in the solution polymerization is less than 0 degree centigrade, it is not practical in terms of the productivity, because the polymerization activity remarkably drops and the amount of double bonds at the molecular terminal of the ethylene/α-olefin copolymer is further lowered. On the other hand, as the temperature is getting higher in the polymerization temperature range of equal to or more than 0 degree centigrade, the solution viscosity during polymerization is lowered, removal of heat of polymerization also becomes easy, and the amount of double bonds at the molecular terminal of the ethylene/α-olefin copolymer is increased. However, the polymerization temperature exceeding 200 degrees centigrade is not practical in terms of productivity, because at such a temperature level, the polymerization activity remarkably drops.

The polymerization pressure is usually from normal pressure to 10 MPa (gauge pressure) and preferably from normal pressure to 8 MPa (gauge pressure). Copolymerization can be carried out in a batchwise, semi-continuous or continuous process. The reaction time (average residence time when a copolymerization reaction is carried out in a continuous process) varies depending on the reaction conditions such as catalyst concentration, polymerization temperature or the like, and can be suitably selected. However, it is usually from 1 minute to 3 hours and preferably from 10 minutes to 2.5 hours. Furthermore, polymerization can also be carried out in two or more stages with different reaction conditions. The molecular weight of the obtained ethylene/α-olefin copolymer can also be adjusted by changing hydrogen concentration in the polymerization system or polymerization temperature. Moreover, the molecular weight can also be adjusted by changing the amount of the compound (II) in use. When hydrogen is to be added, an appropriate added amount is from about 0.001 to 5,000 NL per 1 kg of the ethylene/α-olefin copolymer to be produced. The vinyl group and vinylidene group present in the terminal of molecules of the ethylene/α-olefin copolymer to be produced can be adjusted by increasing the polymerization temperature or reducing the added amount of hydrogen as much as possible.

A solvent used for solution polymerization is usually an inert hydrocarbon solvent and preferably saturated hydrocarbon with a boiling point of 50 to 200 degrees centigrade under normal pressure. Specific examples include aliphatic hydrocarbons such as pentane, hexane, heptane, octane, decane, dodecane, kerosene and the like; and alicyclic hydrocarbons such as cyclopentane, cyclohexane, methylcyclopentane and the like. It should be noted that, Aromatic hydrocarbons such as benzene, toluene, xylene and the like; and halogenated hydrocarbons such as ethylenechloride, chlorobenzene, dichloromethane and the like are also included in the inert hydrocarbon solvent, and there is no limitation on the use thereof.

As described above, in the solution polymerization, not only organic aluminumoxy compounds which are soluble in aromatic hydrocarbons used in the art, but also modified methylaluminoxanes like MMAO, which are soluble in aliphatic hydrocarbons and alicyclic hydrocarbons, can be used. As a result, when aliphatic hydrocarbon or alicyclic hydrocarbon is adopted as a solvent for solution polymerization, it is made possible to almost completely avoid possible mixing of aromatic hydrocarbons into the polymerization system or ethylene/α-olefin copolymer to be produced. In other words, the solution polymerization can reduce environmental loads as well as minimize possible adverse effects on the human body. To suppress variation in physical properties, an ethylene/α-olefin copolymer produced by the polymerization reaction and other desired additives are preferably melted, kneaded and granulated with any optional method.

(Organic Peroxide)

The encapsulating material for solar cell of the present invention is blended with an organic peroxide of peroxyketals represented by the following general formula (1) and having a 1-hour half-life temperature in a range of 100 to 135 degrees centigrade. Organic peroxide is used as a radical initiator when an ethylene/α-olefin copolymer is to be graft-modified with an ethylenically unsaturated silane compound, and is further used as a radical initiator when a crosslinking reaction is carried out at the time of lamination molding of a solar cell module of the ethylene/α-olefin copolymer. By graft-modifying the ethylene/α-olefin copolymer with an ethylenically unsaturated silane compound, it is possible to obtain a solar cell module excellent in adhesion to glass, a backsheet, a cell and an electrode. Furthermore, by crosslinking the ethylene/α-olefin copolymer, it is possible to obtain a solar cell module excellent in heat resistance and adhesiveness.

The encapsulating material for solar cell of the present invention is blended with an organic peroxide of peroxyketals represented by the following general formula (1) and having a 1-hour half-life temperature in a range of 100 to 135 degrees centigrade. An organic peroxide of peroxyketals represented by the following general formula (1) and having a 1-hour half-life temperature in a range of 100 to 130 degrees centigrade is preferably used, and an organic peroxide of peroxyketals represented by the following general formula (1) and having a 1-hour half-life temperature in a range of 100 to 125 degrees centigrade is further preferably used. When the 1-hour half-life temperature is less than 100 degrees centigrade, the solar cell sealing sheet is gelated to obtain it from the resin composition during extrusion sheet molding, and the extruder's torque is increased, so that sheet molding becomes difficult in some cases. Even when a sheet is obtained, a gel-like substance generated in the extruder may create irregularities on the sheet surface which deteriorate the appearance in some cases. Moreover, application of voltage causes cracking around the gel-like substance inside the sheet, and therefore the dielectric breakdown resistance decreases. Furthermore, moisture permeation becomes likely to occur at the interface of the gel-like substance, and therefore moisture permeability decreases. Moreover, the irregularities are generated on the sheet surface, so that adhesion to glass, cells, electrodes and backsheet is worsened during the lamination process of a solar cell module, and the adhesiveness is also lowered. In the case where the extrusion temperature during extrusion sheet molding is reduced to, for example, equal to or less than 100 degrees centigrade, molding can be performed, but the productivity is greatly lowered, the resin is also extruded in a non-melted state, and the appearance of the sheet also is likely to be worsened. Meanwhile, in case of calender molding, the solar cell sealing sheet is gelated to obtain it from the resin composition, the appearance is worsened, the dielectric breakdown resistance is reduced, and the adhesiveness is deteriorated in some cases, in the same manner as in extrusion molding. When the 1-hour half-life temperature of the organic peroxide exceeds 135 degrees centigrade, the crosslinking rate of the solar cell module during lamination molding is slowed down, and the productivity of the solar cell module is greatly lowered. The encapsulating material for solar cell is not sufficiently crosslinked so that heat resistance and adhesiveness are lowered. In addition, the upper limit temperature is about 165 degrees centigrade because the temperature of a laminator and a crosslinking furnace or an oven used for crosslinking for the solar cell module has the temperature limit for the respective devices and cells in the solar cell module. When the 1-hour half-life temperature of the organic peroxide exceeds 135 degrees centigrade, the organic peroxide remains in the encapsulating material for solar cell, a stabilizer in the encapsulating material for solar cell is deteriorated when the solar cell module is used for a long period of time, deterioration of the resin further proceeds, the encapsulating material for solar cell is subject to yellowing, and reduction of the light transmittance and deterioration of the conversion efficiency become likely to occur.

The organic peroxide used in the present invention is an organic peroxide of peroxyketals represented by the following general formula (1), and by the use of the appropriate organic peroxide, a balance between the appearance during sheet molding and the most suitable crosslinking time is excellent, the most suitable crosslinking time is short and therefore crosslinking characteristics are excellent, and bubbles are hardly generated during the lamination and crosslinking process at the time of manufacturing a solar cell module and during long-term usage. Furthermore, the adhesion strength to a metal such as copper foil, aluminum or the like tends to be excellent. Examples of the organic peroxide of peroxyketals represented by the following general formula (1) include 2,2-di(t-butylperoxy)butane, n-butyl-4,4-di(t-butylperoxy)valerate, ethyl-3,3-di(t-butylperoxy)butyrate, 2,2-di(t-amylperoxy)butane, 1,1-di(t-butylperoxy)cyclohexane, 1,1-di(t-amylperoxy)cyclohexane, 1,1-di(t-hexylperoxy)cyclohexane, 1,1-di(t-butylperoxy)-2-methylcyclohexane, 1,1-di(t-amylperoxy)-2-methylcyclohexane, 1,1-di(t-hexylperoxy)-2-methylcyclohexane, 1,1-di(t-butylperoxy)-3,3,5-trimethylcyclohexane, 1,1-di(t-amylperoxy)-3,3,5-trimethylcyclohexane, 1,1-di(t-hexylperoxy)-3,3,5-trimethylcyclohexane, 2,2-di(4,4-di-(t-butylperoxy)cyclohexyl)propane and the like. These organic peroxides may be diluted with inorganic powder, hydrocarbon solvent or aromatic hydrocarbon solvent. Examples of the hydrocarbon solvent include normal paraffin, isoparaffin and the like. Examples of the aromatic hydrocarbon solvent include toluene, xylene and the like. Of these, hydrocarbon solvent is preferable because its influence on adhesiveness and crosslinking characteristics is small. Two or more kinds of these solvents may be used in combination. In the ranges in which the object of the present invention is not impaired, it can also be blended with an organic peroxide of alkyl peroxy esters and peroxy carbonates, such as dilauroyl peroxide, t-butylperoxy isopropyl carbonate, t-butylperoxy benzoate, t-butylperoxy acetate, t-butylperoxy isononanoate, t-butylperoxy-2-ethylhexyl carbonate, t-butylperoxy benzoate and the like prior to use. When it is blended as described above, the blending ratio (PO1/PO2) of an organic peroxide (PO1) of peroxyketals to an organic peroxide (PO2) of alkyl peroxy esters and peroxy carbonates is 1/1 to 1/0.2 (weight ratio).

[Chemical Formula 7]

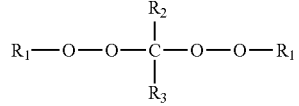

(1)

In the above general formula (1), $R_1$s are each independently a straight-chain or branched alkyl group having 3 to 8 carbon atoms, and preferably a branched alkyl group having 4 to 8 carbon atoms. $R_2$ and $R_3$ are each independently a straight-chain or branched alkyl group having 1 to 8 carbon atoms, or $R_2$ and $R_3$ may be bonded together to form an aliphatic ring having 5 to 9 carbon atoms or an alkyl-substituted aliphatic ring. Examples of the aliphatic ring include cyclohexyl groups. Examples of the alkyl-substituted aliphatic ring include alkyl-substituted cyclohexyl groups and the like. The 5 to 9 carbon atoms mentioned herein indicates the number of carbons to form a ring, and in case of the alkyl-substituted aliphatic ring, alkyl substituent groups are excluded.

The most suitable crosslinking time may be determined from a crosslinking curve of the encapsulating material for solar cell measured in accordance with JIS-K6300-2 under the conditions of a crosslinking temperature of 150 degrees centigrade and a crosslinking time of 30 minutes, using a curelastometer (CURELASTOMETER-V type, a product of Orientec Co., Ltd.). For the most suitable crosslinking time, the time required to reach to a torque value corresponding to the sum of a torque value corresponding to 90% of the difference being between maximum torque value S' max and minimum torque value S' min and minimum torque S' min was defined as Tc90 (min).

In the encapsulating material for solar cell of the present invention, an organic peroxide of peroxyketals represented by the following general formula (1) and having a 1-hour half-life temperature in a range of 100 to 135 degrees centigrade is contained in an amount of 0.1 to less than 0.8 weight parts relative to 100 weight parts of the ethylene/α-olefin copolymer, an organic peroxide of peroxyketals represented by the following general formula (1) and having a 1-hour half-life temperature in a range of 100 to 135 degrees centigrade is preferably contained in an amount of 0.1 to 0.7 weight parts, and an organic peroxide of peroxyketals represented by the following general formula (1) and having a 1-hour half-life temperature in a range of 100 to 135 degrees centigrade is further preferably contained in an amount of 0.2 to 0.6 weight parts. When the amount of an organic peroxide of peroxyketals represented by the following general formula (1) and having a 1-hour half-life temperature in a range of 100 to 135 degrees centigrade is less than 0.1 weight part, crosslinking characteristics become insufficient during lamination molding of a solar cell module, and heat resistance and adhesiveness are likely to be lowered. When the amount of an organic peroxide of peroxyketals represented by the following general formula (1) and having a 1-hour half-life temperature in a range of 100 to 135 degrees centigrade is more than 0.8 weight parts, bubbles are likely to be generated during the lamination and crosslinking process at the time of manufacturing a solar cell module and during long-term usage. In case of extrusion molding, the encapsulating material for solar cell sheet is gelated to obtain it from the resin composition using an extruder or the like, and the extruder's torque is increased, so that extrusion molding becomes difficult in some cases. Even when a sheet is obtained, the generated gel-like substance may create irregularities on the sheet surface which deteriorate the appearance in some cases. In case of calender molding, similarly, the generated gel-like substance may create irregularities on the sheet surface which deteriorate the appearance in some cases. When a gel-like substance is generated, application of voltage causes cracking around the gel-like substance inside the sheet, and therefore the dielectric breakdown resistance decreases. Furthermore, moisture permeation becomes likely to occur at the interface of the gel-like substance, and therefore moisture permeability is lowered. Moreover, the irregularities are generated on the sheet surface, so that adhesion to glass, thin-film electrodes and backsheet is worsened during the lamination process of a solar cell module, and the adhesiveness is also lowered due to insufficient adhesion. For example, in case of extrusion molding, the extrusion temperature during extrusion sheet molding is reduced to, for example, equal to or less than 100 degrees centigrade, molding can be performed, but the productivity is greatly lowered, the resin is also extruded in a non-melted state in some cases, and the appearance tends to be deteriorated.

As one of preferred embodiments, for the encapsulating material for solar cell of the present invention, compounds of the following general formulae (2) to (4) are also preferably used as an organic peroxide of peroxyketals having a 1-hour half-life temperature in a range of 100 to 135 degrees centigrade.

An organic peroxide of peroxyketals having a 1-hour half-life temperature in a range of 100 to 135 degrees centigrade of the general formula (2) is a compound,

[Chemical Formula 8]

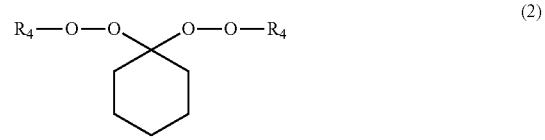

(2)

wherein, in the above general formula (2), $R_4$s each independently represent a straight-chain or branched alkyl group having 3 to 8 carbon atoms, and preferably a branched alkyl group having 4 to 8 carbon atoms.

Specific examples include 1,1-di(t-butylperoxy)cyclohexane, 1,1-di(t-amylperoxy)cyclohexane, 1,1-di(t-hexylperoxy)cyclohexane and the like.

An organic peroxide of peroxyketals having a 1-hour half-life temperature in a range of 100 to 135 degrees centigrade of the general formula (3) is a compound,

[Chemical Formula 9]

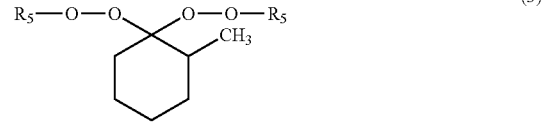

(3)

wherein, in the above general formula (3), $R_5$s each independently represent a straight-chain or branched alkyl group having 3 to 8 carbon atoms, and preferably a branched alkyl group having 4 to 8 carbon atoms.

Specific examples include 1,1-di(t-butylperoxy)-2-methylcyclohexane, 1,1-di(t-amylperoxy)-2-methylcyclohexane, 1,1-di(t-hexylperoxy)-2-methylcyclohexane and the like.

An organic peroxide of peroxyketals having a 1-hour half-life temperature in a range of 100 to 135 degrees centigrade of the general formula (4) is a compound,

[Chemical Formula 10]

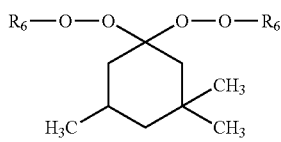

(4)

wherein, in the above general formula (4), $R_6$s each independently represent a straight-chain or branched alkyl group having 3 to 8 carbon atoms, and preferably a branched alkyl group having 4 to 8 carbon atoms.

Specific examples include 1,1-di(t-butylperoxy)-3,3,5-trimethylcyclohexane, 1,1-di(t-amylperoxy)-3,3,5-trimethylcyclohexane, 1,1-di(t-hexylperoxy)-3,3,5-trimethylcyclohexane and the like.

(Ethylene Resin Composition)

According to a preferred aspect, the encapsulating material for solar cell of the present invention is composed of an ethylene resin composition containing 100 weight parts of the aforementioned ethylene/α-olefin copolymer and preferably 0.1 to 5 weight parts, more preferably 0.1 to 4 weight parts, and further preferably from 0.1 to 3 weight parts of a silane coupling agent such as an ethylenically unsaturated silane compound or the like.

(Ethylenically Unsaturated Silane Compound)

In the case where the amount of the ethylenically unsaturated silane compound is less than 0.1 weight part, adhesiveness is lowered. On the other hand, in the case where the amount of the ethylenically unsaturated silane compound exceeds 5 weight parts, a balance between the costs and performance of the encapsulating material for solar cell is worsened, and the amount of organic peroxide added for the graft reaction of the ethylene/α-olefin copolymer with an ethylenically unsaturated silane compound at the time of lamination of a solar cell module is increased. Whereby, in case of extrusion molding, the encapsulating material for solar cell sheet is gelated to obtain it from the resin composition using an extruder or the like, and the extruder's torque is increased, so that sheet molding becomes difficult in some cases. Even when a sheet is obtained, gels generated in the extruder may create irregularities on the sheet surface which deteriorate the appearance in some cases. In case of calender molding, similarly, the generated gel-like substance may create irregularities on the sheet surface which deteriorate the appearance in some cases. When a gel-like substance is generated, application of voltage causes cracking around the gel-like substance inside the sheet, and therefore the dielectric breakdown resistance decreases.

Furthermore, moisture permeation becomes likely to occur at the gel interface, thus reducing moisture permeability. Irregularities formed on the sheet surface reduce its adhesion to glass, a film electrode and a backsheet during the lamination process of a solar cell module, so that adhesion is also lowered. The ethylenically unsaturated silane compound itself causes a condensation reaction to occur and is present in the encapsulating material for solar cell as white stripes, thus deteriorating the appearance of the product. When the amount of organic peroxide is small after the surplus silane coupling agent is subjected to a condensation reaction with an adherend such as glass or the like, the graft reaction to main chains of the ethylene/α-olefin copolymer becomes insufficient, so that adhesiveness also tends to be lowered.

The ethylenically unsaturated silane compound is not particularly limited and ethylenically unsaturated silane compounds known in the art can be used. Specific examples include vinyltriethoxysilane, vinyltrimethoxysilane, vinyl-tris(β-methoxyethoxysilane), γ-glycidoxypropyltrimethoxysilane, γ-aminopropyltriethoxysilane, γ-methacryloxypropyltrimethoxysilane and the like. Preferably used are γ-glycidoxypropylmethoxysilane, γ-aminopropyltriethoxysilane, γ-methacryloxypropyltrimethoxysilane and vinyltriethoxysilane, which are excellent in adhesiveness.

(Ultraviolet Absorber, Light Stabilizer, Heat-Resistant Stabilizer)

It is preferable that the ethylene resin composition may contain at least one additive selected from the group consisting of an ultraviolet absorber, a light stabilizer and a heat-resistant stabilizer. The compounding amount of the additive is preferably from 0.005 to 5 weight parts, based on 100 weight parts of the ethylene/α-olefin copolymer. It is preferable to add at least two kinds of the additives selected from the above three kinds, and it is particularly preferable to add all of the three kinds. In the case where the compounding amount of the aforementioned additive is within the above range, it is possible to fully ensure improvement of resistance to constant temperature and humidity, resistance of the heat cycle, weather resistant stability and heat resistant stability, as well as to prevent reduction in the transparency of the encapsulating material for solar cell and its adhesion to glass, a backsheet, a cell, an electrode and aluminum.

Specific examples of the ultraviolet absorber include benzophenones such as 2-hydroxy-4-n-octyloxybenzophenone, 2-hydroxy-4-methoxybenzophenone, 2,2-dihydroxy-4-methoxybenzophenone, 2-hydroxy-4-methoxy-4-carboxybenzophenone, 2-hydroxy-4-N-octoxybenzophenone and the like; benzotriazoles such as 2-(2-hydroxy-3,5-di-t-butylphenyl)benzotriazole, 2-(2-hydroxy-5-methylphenyl)benzotriazole and the like; and Salicylic acid esters such as phenylsalicylate, p-octylphenylsalicylate and the like.

As the light stabilizer, preferably used are hindered amines and hindered piperidine compounds such as bis(2,2,6,6-tetramethyl-4-piperidyl)sebacate, poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] and the like.

Specific examples of the heat-resistant stabilizer include hindered phenol type heat-resistant stabilizers such as 1,1,3-tris-(2-methyl-4-hydroxy-5-t-butylphenyl)butane, 4,4'-butylidene bis-(3-methyl-6-t-butylphenol), 2,2-thiobis(4-methyl-6-t-butylphenol), 7-octadecyl-3-(4'-hydroxy-3',5'-di-t-butylphenyl)propionate, tetrakis-[methylene-3-(3',5'-di-t-butyl-4'-hydroxyphenyl)propionate]methane, pentaerythritol-tetrakis[3-(3,5-di-t-butyl-4-hydroxyphenyl)propionate], triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,4-bis(n-octylthio)-6-(4-hydroxy-3,5-di-t-butylanilino)-1,3,5-triazine, tris-(3,5-di-t-butyl-4-hydroxybenzyl)-isocyanurate, 2,2-thiodiethylene bis[3-(3,5-di-t-butyl-4-hydroxyphenyl)propionate], N,N'-hexamethylene bis(3,5-di-t-butyl-4-hydroxy)-hydrocinnamide, 2,4-bis[(octylthio)methyl]-o-cresol, 3,5-di-t-butyl-4-hydroxybenzyl-phosphonate-diethyl ester, tetrakis[methylene(3,5-di-t-butyl-4-hydroxy-hydrocinnamate)]methane, octadecyl-3-(3,5-di-t-butyl-4-hydroxyphenyl)propionate, 3,9-bis[2-[3-(3-t-butyl-4-hydroxy-5-methylphenyl)propionyloxy]-1,1-dimethylethyl]-2,4-8,10-tetraoxaspiro[5.5]undecane and the like;

phosphite type heat-resistant stabilizers such as tris(2,4-di-tert-butylphenyl)phosphite, phosphorous acid bis[2,4-bis(1,1-dimethylethyl)-6-methylphenyl]ethyl ester, tetrakis(2,4-di-tert-butylphenyl)[1,1-biphenyl]-4,4'-diylbis phosphonite, bis(2,4-di-tert-butylphenyl)pentaerythritol diphosphite and the like;

lactone type heat-resistant stabilizers such as the reaction product of 3-hydroxy-5,7-di-tert-butyl-furan-2-one with o-xylene and the like;

amine type heat-resistant stabilizers; and sulfur type heat-resistant stabilizers such as dimyristyl thiodipropionate, dilauryl thiodipropionate, distearyl thiodipropionate, ditridecyl thiodipropionate, pentaerythritol-tetrakis-(β-laurylthiopropionate), 2-mercaptobenzimidazole, zinc salt of 2-mercaptobenzimidazole, 2-mercaptomethylbenzimidazole, zinc salt of 2-mercaptomethylbenzimidazole, 4,4'-thiobis(6-t-butyl-3-methylphenol), 2,6-di-t-butyl-4-(4,6-bis(octylthio)-1,3,5-triazine-2-ylamino)phenol and the like. These may be used singly, or two or more kinds may be used in combination. Of these, preferably used are hindered phenol type heat-resistant stabilizers such as pentaerythritol-tetrakis[3-(3,5-di-t-butyl-4-hydroxyphenyl)propionate], octadecyl-3-(3,5-di-t-butyl-4-hydroxyphenyl) propionate and the like; phosphite type heat-resistant stabilizers such as tris(2,4-di-tert-butylphenyl)phosphite; and sulfur type heat-resistant stabilizers such as 2-mercaptobenzimidazole, zinc salt of 2-mercaptobenzimidazole, 2-mercaptomethylbenzimidazole, zinc salt of 2-mercaptomethylbenzimidazole, 4,4'-thiobis(6-t-butyl-3-methylphenol), 2,6-di-t-butyl-4-(4,6-bis(octylthio)-1,3,5-triazine-2-ylamino)phenol and the like.

When the encapsulating material for solar cell of the present invention is blended with a hindered phenol type antioxidant, the hindered phenol type antioxidant is preferably contained in an amount of 0.001 to 0.5 weight parts, further preferably in an amount of 0.001 to 0.4 weight parts, more preferably in an amount of 0.002 to 0.4 weight parts, and particularly preferably in an amount of 0.003 to 0.3 weight parts, relative to 100 weight parts of the ethylene/α-olefin copolymer. When the amount of the hindered phenol type antioxidant is less than 0.001 weight part, heat resistance is lowered, and in a heat-resistant aging test at a high temperature of, for example, equal to or more than 120 degrees centigrade, the encapsulating material for solar cell is likely to be subject to yellowing. When the amount of the hindered phenol type antioxidant exceeds 0.5 weight parts, crosslinking characteristics of the encapsulating material for solar cell are worsened, and heat resistance and adhesiveness are likely to be lowered. Meanwhile, decomposition and reaction of the hindered phenol type antioxidant are accelerated due to blending of an organic peroxide, and a solar cell sealing sheet is subject to yellowing or a compound absorbing a wavelength of 300 nm to 500 nm is generated, so that the conversion efficiency of the solar cell module is likely to be lowered.

(Other Additives)

In addition to the above components, the ethylene resin composition constituting the encapsulating material for solar cell may suitably contain various components in the ranges in which the object of the present invention is not impaired. Examples include various polyolefins other than the ethylene/α-olefin copolymer, styrene based or ethylene based block copolymers, propylene based polymers and the like. These components may be contained in an amount of 0.0001 to 50 weight parts and preferably 0.001 to 40 weight parts, based on 100 weight parts of the aforementioned ethylene/α-olefin copolymer. Furthermore, at least one kind of the additives selected from various resins other than polyolefins, and/or various rubbers, plasticizers, fillers, pigments, dyes, anti-static agents, anti-bacterial agents, anti-mold agents, flame retardants, crosslinking aids and dispersing agents may be suitably contained.

In particular, when a crosslinking aid is contained, the compounding amount of the crosslinking aid is from 0.05 to 5 weight parts, based on 100 weight parts of the ethylene/α-olefin copolymer. In the case where the compounding amount of the crosslinking aid is within the range, the resultant ethylene resin composition may have a suitable crosslinked structure and thus have improved heat resistance, mechanical properties and adhesion.

As the crosslinking aid, there may be used crosslinking aids known in the art which are generally used for producing olefin based resins. Such a crosslinking aid is a compound having two or more double bonds in a molecule. Specific examples include monoacrylates such as t-butyl acrylate, lauryl acrylate, cetyl acrylate, stearyl acrylate, 2-methoxyethyl acrylate, ethylcarbitol acrylate, methoxytripropylene glycol acrylate and the like; monomethacrylates such as t-butyl methacrylate, lauryl methacrylate, cetyl methacrylate, stearyl methacrylate, methoxyethylene glycol methacrylate, methoxypolyethylene glycol methacrylate and the like; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, polypropylene glycol diacrylate and the like; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate, polyethylene glycol dimethacrylate and the like; triacrylates such as trimethylolpropane triacrylate, tetramethylolmethane triacrylate, pentaerythritol triacrylate and the like; trimethacrylates such as trimethylolpropane trimethacrylate, trimethylolethane trimethacrylate and the like; tetraacrylates such as pentaerythritol tetraacrylate, tetramethylolmethane tetraacrylate and the like; divinyl aromatic compounds such as divinylbenzene, di-1-propenylbenzene and the like; cyanurates such as triallyl cyanurate, triallyl isocyanurate and the like; triallyl compounds such as diallyl phthalate and the like; diallyl compounds; oximes such as p-quinonedioxime, p-p'-dibenzoyl quinonedioxime and the like; and maleimides such as phenylmaleimide and the like. Among these crosslinking aids, more preferably used are diacrylates; dimethacrylates; cyanurates; divinyl aromatic compounds and that like.

(Encapsulating Material for Solar Cell)

The encapsulating material for solar cell of the present invention is excellent in a balance among transparency, flexibility, adhesiveness, heat resistance, electrical characteristics and crosslinking characteristics, and further in weather resistance, moisture permeability and process stability, and generation of bubbles is suppressed during the lamination and crosslinking process at the time of manufacturing a solar cell module and during long-term usage. Thus, the encapsulating material for solar cell of the present invention is suitably used as an encapsulating material for solar cell of a solar cell module that is known in the past. A typical method is used as a method for manufacturing the encapsulating material for solar cell of the present invention, but the encapsulating material for solar cell of the present invention is preferably produced by melt-blending the above-described components using a kneader, a banbury mixer, an extruder or a calender molding machine. In particular, the encapsulating material for solar cell of the present invention is preferably produced with a molding machine or a calender molding machine which enables continuous production.

According to another preferred exemplary embodiment, the entire shape of the encapsulating material for solar cell is in a sheet form. Furthermore, an encapsulating material for solar cell having at least one layer of a sheet consisting of the aforementioned ethylene resin composition and combined with additional layers can also be suitably used. The thickness of a layer of the encapsulating material for solar cell is usually from 0.01 to 2 mm, preferably from 0.05 to 1.5 mm, further preferably from 0.1 to 1.2 mm, particularly preferably from 0.2 to 1 mm, more preferably from 0.3 to 0.9 mm, and most preferably from 0.3 to 0.8 mm. In the case where the thickness is within this range, breakage of glass, a solar cell element, a thin film electrode or the like can be suppressed during the lamination process, and high photovoltaic power can be achieved by securing sufficient light transmittance. Such a thickness is preferable because lamination molding of a solar cell module can be performed at a low temperature.

There are no particular limitations on the method of molding a sheet made of an encapsulating material for solar cell, and various molding methods known in the art (cast molding, extrusion sheet molding, inflation molding, injection molding, compression molding, calendar molding and the like) can be employed. In particular, one of preferred embodiments of the present invention is to obtain an encapsulating material for solar cell in a sheet form by subjecting an ethylene/α-olefin copolymer having MFR of a2)-1, an ethylenically unsaturated silane compound, an organic peroxide, a UV absorber, a light stabilizer, a heat-resistant stabilizer and other additives as necessary to melt-kneading and extrusion sheet molding in an extruder. The range of the extrusion temperature is from 100 to 130 degrees centigrade. In the case where the extrusion temperature is less than 100 degrees centigrade, the productivity of the encapsulating material for solar cell is lowered. Furthermore, the resin is also extruded in a non-melted state in some cases, and the appearance of the sheet is also likely to be worsened. In the case where the extrusion temperature exceeds 130 degrees centigrade, the ethylene resin composition used for an encapsulating material for solar cell is made into a sheet using an extruder and is gelated when to obtain an encapsulating material for solar cell, and the extruder's torque is increased, so that sheet molding becomes difficult in some cases. Even when a sheet is obtained, gels generated in the extruder may create irregularities on the sheet surface which deteriorate the appearance in some cases. Moreover, application of a voltage cause cracks around gels inside the sheet, thus reducing the dielectric breakdown resistance. Furthermore, moisture permeation becomes likely to occur at the gel interface, thus reducing moisture permeability. Irregularities formed on the sheet surface reduce its adhesion to glass, a cell, an electrode and a backsheet during the lamination process of a solar cell module, so that adhesion is also lowered. In particular, another preferred embodiment of the present invention is to obtain an encapsulating material for solar cell in a sheet form by subjecting an ethylene/α-olefin copolymer having MFR of a2)-2, a silane coupling agent, an organic peroxide, a UV absorber, a light stabilizer, a heat-resistant stabilizer and other additives to be used as necessary to melt-kneading and calendar molding using a calender molding machine, where the molten resin is rolled with heated metal rolls (calender rolls) into a sheet or a film having a desired thickness. As a calendar molding machine, various known calender molding machines can be employed; for example, a mixing roll mill, a three roll calender, or a four roll calender can be employed. The four roll calender may include calender rolls arranged in I form, S form, inverted L form, Z form, slanted Z form, and the like. Prior to the calendering process, it is also preferable to heat the ethylene resin composition to a moderate temperature. For example, it is also preferable to install a Banbury mixer, a kneader, or an extruder. It is preferable that the calender roll temperature for calender molding is typically from 40 to 100 degrees centigrade. When the roll temperature is equal to or more than 40 degrees centigrade, the molten ethylene resin composition is well fed into the rolling bank, and therefore the productivity of the encapsulating material for solar cell is excellent. On the other hand, when the roll temperature is equal to or less than 100 degrees centigrade, gelation can be prevented when the encapsulating material for solar cell is calendered into a sheet with a calender molding machine. The irregularities are formed on the surface of the sheet due to the presence of a gel-like matter and therefore the appearance is deteriorated in some cases. Moreover, application of voltage to the sheet containing a gel-like substance causes cracking around the gel-like substance inside the sheet, and therefore the dielectric breakdown resistance decreases. Furthermore, moisture permeation becomes likely to occur at the interface of the gel-like substance, and therefore moisture permeability is lowered. Moreover, the irregularities are generated on the sheet surface, so that adhesion to glass, solar cell elements, electrodes and backsheet is worsened during the lamination process of a solar cell module, and the adhesiveness is also lowered. Accordingly, it is possible to obtain a sealing sheet excellent in appearance, dielectric breakdown resistance, moisture permeability and adhesiveness by preventing gelation.

Meanwhile, a sheet (or layer) made of the encapsulating material for solar cell may be embossed on its surface. By embossing the sheet surface of the encapsulating material for solar cell, blocking between the encapsulating sheets or between the encapsulating sheet and other sheet can be avoided. Furthermore, since embossed features reduce the storage elastic modulus of the encapsulating material for solar cell (encapsulating material sheet for solar cell), they act as a cushion for solar cell elements during the lamination of the encapsulating material sheet for solar cell and the solar cell elements, and thus breakage of the solar cell elements can be avoided.

The porosity (P) (%) of the encapsulating material sheet for solar cell is preferably from 10 to 50%, more preferably from 10 to 40%, and further preferably from 15 to 40%, and the porosity (P) is defined as the percentage ratio ($V_H/V_A \times 100$) of the total volume ($V_H$) of concave portions per unit area of the encapsulating material sheet for solar cell to its apparent volume ($V_A$) of the encapsulating material sheet for solar cell. It should be noted that, the apparent volume ($V_A$) of the encapsulating material sheet for solar cell is determined by multiplying the maximum thickness of the encapsulating material sheet for solar cell by the unit area. When the porosity (P) is less than 10%, the elastic modulus of the encapsulating material for solar cell is not sufficiently lowered and sufficient cushion is not achieved. Thus, when modules are laminated together in the second stage (pressurizing step) during the manufacture of a module, breakage of silicon cell or solder that fixes the silicon cell to the electrode occurs in the case of crystalline solar cells, or breakage of silver electrode occurs in the case of thin film solar cells. Specifically, in the case where the porosity (P) of the encapsulating material for solar cell containing a sheet made of the ethylene resin composition is less than 10%, when the encapsulating material for solar cell is locally loaded with pressure, pressurized convex portions are not deformed like being collapsed. This causes breakage of, for example, silicon cells during the lamination process as a result of local application of large pressure on the silicon cells. Moreover, in the case where the porosity (P) of the encapsulating material for solar cell is less than 10%, there is less space for air to travel through, resulting in failure to pump out the air during the lamination process. The air trapped in the solar cell module may deteriorate the appearance, or the moisture remained in the air may corrode electrodes during long-term usage in some cases. Moreover, during the lamination process, the melted ethylene resin composition fails to fill the space, and therefore the excessive ethylene resin composition may squeeze out of respective adherends of the solar cell modules to contaminate the laminator in some cases.

On the other hand, in the case where the porosity (P) is greater than 80%, it becomes likely that air cannot be completely removed during the pressurizing step of the lamination process, so that the air remains trapped in the solar cell module. The air trapped in the solar cell module may deteriorate the appearance of the solar cell module, or the moisture remained in the air may corrode electrodes during long-term usage. Failure to completely remove the air during the pressurizing step of the lamination process also reduces the contact area between the encapsulating material for solar cell and the adherend, thus leading to poor adhesion strength.

The porosity (P) can be determined through the following calculation. The apparent volume $V_A$ (mm$^3$) of the embossed encapsulating material for solar cell is calculated by multiplying the maximum thickness $t_{max}$ (mm) of the encapsulating material for solar cell by the unit area (for example, 1 m$^2$=1000×1000=10$^6$ mm$^2$) according to the following equation (a):

$$V_A \text{ (mm}^3\text{)}=t_{max} \text{ (mm)} \times 10^6 \text{ (mm}^2\text{)} \qquad (a)$$

On the other hand, the actual volume $V_0$ (mm$^3$) of the encapsulating material for solar cell for the unit area is calculated by substituting specific gravity $\rho$ (g/mm$^3$) of the resin constituting the encapsulating material for solar cell and the actual weight W (g) of the encapsulating material for solar cell per unit area (1 m$^2$) into the following equation (b):

$$V_0 \text{ (mm}^3\text{)}=W/\rho \qquad (b)$$

The total volume $V_H$ (mm$^3$) of the concave portions per unit area of the encapsulating material for solar cell is calculated by subtracting the actual volume $V_0$ from the apparent volume $V_A$ of the encapsulating material for solar cell as shown in the following equation (c):

$$V_H \text{ (mm}^3\text{)}=V_A-V_0=V_A-(W/\rho) \qquad (c)$$

The porosity (%) can thus be determined according to the following equation:

$$\begin{aligned}\text{Porosity}(P)(\%) &= V_H/V_A \times 100 \\ &= (V_A - (W/\rho))/V_A \times 100 \\ &= 1 - W/(\rho \cdot V_A) \times 100 \\ &= 1 - W/(\rho \cdot t_{max} \cdot 10^6) \times 100\end{aligned}$$

The porosity (%) can be determined according to the above equation, and can also be determined by microscopic observation, image processing or the like of an actual cross section or embossed surface of the encapsulating material for solar cell.

The depth of the concave portions formed by embossing is preferably from 20 to 95%, more preferably from 50 to 95%, and further preferably from 65 to 95% of the maximum thickness of the encapsulating material for solar cell. The percentage ratio of the depth (D) of the concave portions to the maximum sheet thickness $t_{max}$ may be referred to as the depth ratio of the concave portions in some cases.

The depth of the embossed concave portions refers to the vertical interval D between the top of the convex portions and the bottom of the concave portions on the embossed irregular surface of the encapsulating material for solar cell. The maximum thickness $t_{max}$ of the encapsulating material for solar cell refers to the distance from the top of the convex portions on the embossed surface of the encapsulating material for solar cell to the other surface (in the thickness direction of the encapsulating material for solar cell) in the case where the encapsulating material for solar cell is embossed on one surface, and the distance from the top of the convex portions on one surface to the top of the convex portions on the other surface (in the thickness direction of the encapsulating material for solar cell) in the case where the encapsulating material for solar cell is embossed on both surfaces.

Embossing may be performed on one surface or both surfaces of the encapsulating material for solar cell. When the depth of the embossed concave portions is increased, embossing is preferably performed on only one surface of the encapsulating material for solar cell. In the case where the encapsulating material for solar cell is embossed on only one surface, the maximum thickness $t_{max}$ of the encapsulating material for solar cell is from 0.01 to 2 mm, preferably from 0.05 to 1 mm, further preferably from 0.1 to 1 mm, further preferably from 0.15 to 1 mm, further preferably from 0.2 to 1 mm, further preferably from 0.2 to 0.9 mm, further preferably from 0.3 to 0.9 mm, and the most preferably from 0.3 to 0.8 mm. In the case where the maximum thickness $t_{max}$ of the encapsulating material for solar cell is within this range, not only possible breakage of glass, a solar cell element, a thin film electrode and the like can be avoided in the lamination process, but the lamination molding of a solar cell module is made possible at a relatively low temperature; therefore, it is preferable. Moreover, the encapsulating material for solar cell can have sufficient light transmittance, and a solar cell module using the encapsulating material for solar cell generates high photovoltaic power.

Meanwhile, the sheet can be used as an encapsulating material for solar cell in a sheet form which is cut to a size to fit the solar cell module or in a roll form which can be cut to a size to fit the solar cell module right before the manufacture of it. According to a preferred exemplary embodiment of the present invention, the encapsulating material for solar cell (encapsulating material sheet for solar cell) in a sheet form may have at least one layer made of the encapsulating material for solar cell. Accordingly, the number of layers made of the encapsulating material for solar cell of the present invention may be either one, or two or more. The number of layers is preferably one from the viewpoints of simplifying the structure for lower costs and reducing the reflection of light at the interface between layers for efficient utilization of light as much as possible.

The encapsulating material sheet for solar cell may be composed of only layers made of the encapsulating material for solar cell of the present invention, or may additionally have layers other than layers containing the encapsulating material for solar cell (hereinafter also referred to as the additional layers). Examples of additional layers include, when classified according to the intended purpose, a hard coating layer for protecting a surface or a back surface, an adhesive layer, an anti-reflection layer, a gas barrier layer, an anti-fouling layer and the like. Examples of additional layers include, when classified according to the material, a layer made of an ultraviolet curable resin, a layer made of a thermosetting resin, a layer made of a polyolefin resin, a layer made of a carboxylic acid-modified polyolefin resin, a layer made of a fluorine-containing resin, a layer made of a cyclic olefin (co)polymer, a layer made of an inorganic compound and the like.

There are no particular limitations on the positional relationship between the layer made of the encapsulating material for solar cell of the present invention and the additional layers. A preferable layer construction is properly selected in relation to the purpose of the present invention. That is, the additional layers may be provided between two or more layers made of the encapsulating material for solar cell, may be located at the outermost layer of the encapsulating material sheet for solar cell, or may be provided at other positions. Furthermore, the additional layers may be provided on only one surface or both surfaces of the layer made of the encapsulating material for solar cell. The number of the additional layers is not particularly limited, and any number of the additional layers may be provided or may not be provided.

From the viewpoints of simplifying the structure for lower costs and reducing the reflection of light at the interface for efficient utilization of light as much as possible, the encapsulating material sheet for solar cell may be manufactured only with a layer made of the encapsulating material for solar cell of the present invention without providing additional layers. However, when the additional layers are needed in relation to the purpose or are useful, such additional layers may be properly provided. When the additional layers are provided, there are no particular limitations on the lamination method in which the layer made of the encapsulating material for solar cell of the present invention is laminated to additional layers. It is preferable to employ a method in which a laminate is obtained by co-extrusion using a known melt extruder such as a cast molding machine, an extrusion sheet molding machine, an inflation molding machine, an injection molding machine or the like, or a method in which one layer formed previously is laminated to the other layer by melting or heating so as to obtain a laminate. Moreover, the lamination may be effected through a dry lamination method or a heat lamination method in which a suitable adhesive is used. Examples of the adhesive include maleic anhydride-modified polyolefin resins such as "ADMER" (trademark) manufactured by Mitsui Chemicals, Inc. and "MODIC" (trademark) manufactured by Mitsubishi Chemical Corporation; low (non) crystalline elastic polymers such as unsaturated polyolefin and the like; acrylic adhesives represented by a terpolymer of ethylene, acrylate and maleic anhydride such as "BONDINE" (trademark) manufactured by Sumica CDF; ethylene/vinyl acetate copolymers; and adhesive resin compositions containing the foregoing. Adhesives with heat resistance of about 120 to 150 degrees centigrade are preferably used. Preferable examples thereof include polyester based and polyurethane based adhesives. In order to improve adhesion between the two layers, they may be subjected, for example, to silane coupling treatment, titanium coupling treatment, corona treatment, plasma treatment or the like.

2. Solar Cell Module

Examples of the solar cell module include crystalline solar cell modules in which solar cell elements formed using polycrystalline silicon or the like are sandwiched between the encapsulating material sheets for solar cell, and the module is covered with protective sheets on both surfaces. That is, a typical solar cell module consists of a protective sheet for a solar cell module (surface protective member), an encapsulating material sheet for solar cell, a solar cell element, an encapsulating material sheet for solar cell and a protective sheet for a solar cell module (back surface protective member). However, according to a preferred exemplary embodiment of the present invention, the structure of the solar cell module is not limited to the above structure. Some of the above respective layers may be properly omitted, or the above additional layers may be properly provided in the ranges in which the object of the present invention is not impaired. Examples of the additional layers include an adhesive layer, a shock absorbing layer, a coating layer, an anti-reflection layer, a back surface re-reflection layer, a light diffusion layer and the like. These layers are not particularly limited, and can be provided in any desired location in consideration of the intended purpose of respective layers and their characteristics.

(Crystalline Silicon Solar Cell Module)

FIG. 1 is a cross sectional view schematically illustrating one exemplary embodiment of a solar cell module of the present invention. It should be noted that, in FIG. 1, an example of a configuration of a crystalline silicon solar cell module 20 is illustrated. As illustrated in FIG. 1, the solar cell module 20 has a plurality of crystalline silicon solar cell elements 22 electrically interconnected via interconnectors 29, and a pair of a surface protective member 24 and a back surface protective member 26 which sandwich solar cell elements 22. An encapsulating layer 28 is filled among these protective members and a plurality of solar cell elements 22. The encapsulating layer 28 is obtained by bonding together the encapsulating material sheets for solar cell of the present invention and pressing the bonded sheets under heating. The encapsulating layer 28 is in contact with electrodes respectively formed on the light-incident surface and the back surface of each solar cell element 22. These electrodes are current collectors respectively formed on the light-incident surface and the back surface of respective solar cell elements 22, and each includes collector lines, tab-type busbars, back surface electrode layers and the like.

Figure 2:
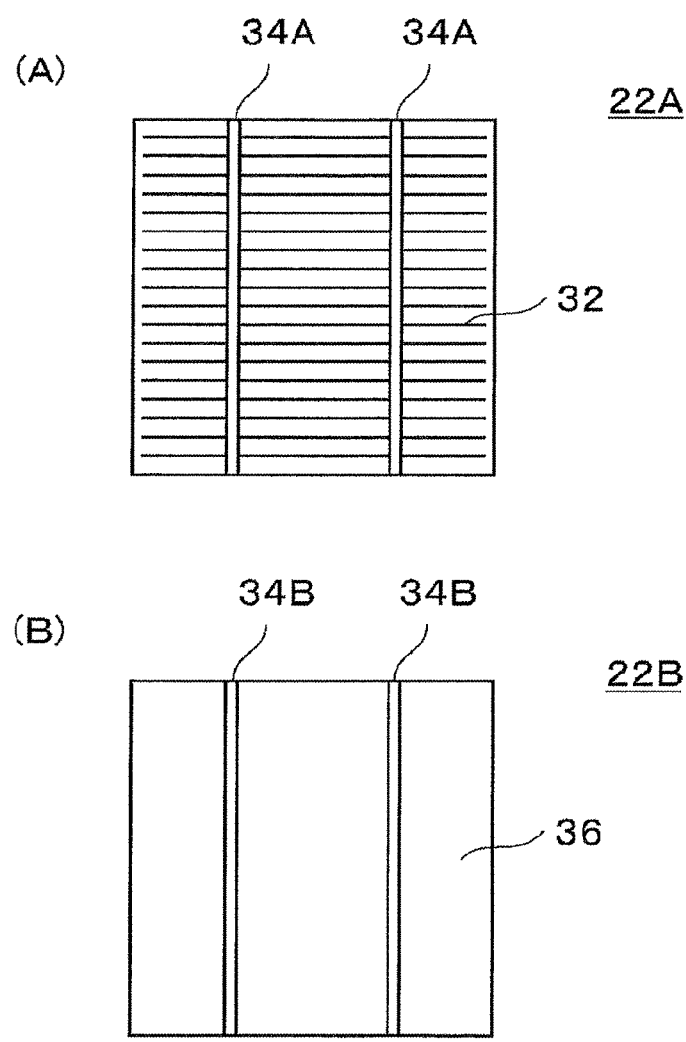
FIG. 2 is a plan view schematically illustrating a configuration of a light-incident surface and a back surface of the solar cell.

FIG. 2 is a plan view schematically illustrating a configuration of a light-incident surface and a back surface of the solar cell element. In FIG. 2, an example of a configuration of a light-incident surface 22A and a back surface 22B of the solar cell elements 22 is illustrated. As illustrated in FIG. 2(A), the solar cell element 22 includes multiple collector lines 32 in a line form, and tab-type busbars 34A that are connected to interconnectors 29 and collect electrical charges from the collector lines 32 formed on the light-incident surface 22A. Moreover, as shown in FIG. 2(B), the solar cell element 22 includes a conductive layer (back surface electrode) 36 formed on the entire surface of the back surface 22B, and tab-type busbars 34B formed thereon that are connected to interconnectors 29 and collect electrical charges from the conductive layer 36. The line width of the collector lines 32 is, for example, about 0.1 mm; the line width of the tab-type busbars 34A is, for example, about 2 to 3 mm; and the line width of the tab-type busbars 34B is, for example, about 5 to 7 mm. The thickness of the collector lines 32, tab-type busbars 34A and tab-type busbars 34B is, for example, about 20 to 50 μm.

It is preferable that the collector lines 32, tab-type busbars 34A and tab-type busbars 34B contain a metal with high conductivity. Examples of the metal with high conductivity include gold, silver, copper and the like, and preferably used are silver, silver compounds, silver-containing alloys and the like from the viewpoints of high conductivity and high corrosion resistance. It is preferable that the conductive layer 36 contains not only a metal with high conductivity, but also a component with high light reflectivity, such as aluminum, for reflecting light incident on the light-incident surface to enhance the opto-electronic conversion efficiency of the solar cell element. The collector lines 32, tab-type busbars 34A, tab-type busbars 34B and conductive layer 36 are formed by applying a conductive material paint containing the aforementioned metal with high conductivity onto either the light-incident surface 22A or the back surface 22B of the solar cell elements 22, by, for example, screen printing to a thickness of 50 μm, drying the applied material and, as necessary, baking the applied material at 600 to 700 degrees centigrade.

The surface protective member 24 needs to be transparent as it is placed on the light-incident surface side. Examples of the surface protective member 24 include transparent glass plates, transparent resin films and the like. On the other hand, the back surface protective member 26 needs not to be transparent; therefore, the material thereof is not particularly limited. Examples of the back surface protective member 26 include glass substrates, plastic films and the like, and glass substrates are suitably used from the viewpoints of durability and transparency.

The solar cell module 20 can be obtained by any production method. The solar cell module 20 can be obtained by, for example, a production method including the steps of: obtaining a laminate in which the back surface protective member 26, an encapsulating material sheet for solar cell, a plurality of solar cell elements 22, an encapsulating material sheet for solar cell and the surface protective member 24 are laminated in this order; pressing the laminate with a laminator or the like and optionally heating the laminate as necessary; and further curing the aforementioned encapsulating material by heating the laminate as necessary after the above steps. Furthermore, for example, solar cell elements may be manufactured by forming a thin film of amorphous silicon of several micrometers thickness onto a glass or film substrate by chemical vapor deposition (CVD) using silane gas, and depositing thereon an electrode (e.g., Ag electrode) by sputtering as necessary. A thin-film amorphous solar cell module may then be manufactured by laminating, in the order of the solar cell elements, the solar cell sealing sheet and a protective sheet for the solar cell module (back surface protective member).

(Thin Film Silicon (Amorphous Silicon) Solar Cell Module)

The thin film silicon solar cell module may be configured as (1) a laminate in which module components are laminated in the order of a surface protective member (glass substrate), a thin film solar cell element, an encapsulating layer and a back surface protective member; (2) a laminate in which module components are laminated in the order of a surface protective member, an encapsulating layer, a thin film solar cell element, an encapsulating layer and a back surface protective member; or the like. The surface protective member, the back surface protective member and the encapsulating layer are identical to those for the crystalline silicon solar cell module described above.

According to the aspect (1), the thin film solar cell element contains, for example, a transparent electrode layer, a pin type silicon layer and a back surface electrode layer in this order. Examples of the transparent electrode layer include semiconductor oxides such as $In_2O_3$, $SnO_2$, ZnO, $Cd_2SnO_4$, ITO ($In_2O_3$ doped with Sn) and the like. Examples of the back surface electrode layer include thin film silver layers. Respective layers are formed by plasma CVD (chemical vapor deposition) or sputtering. The encapsulating layer is placed so as to contact with the back surface electrode layer (for example, thin film silver layer). The transparent electrode layer is formed on the surface protective member, so that the encapsulating layer is not placed between the surface protective member and the transparent electrode layer in many cases.

According to the aspect (2), the thin film solar cell element contains, for example, a transparent electrode layer, a pin type silicon layer and a metal foil or a thin film metal layer (for example, thin film silver layer) formed on the heat-resistant polymer film in this order. Examples of the metal foil include stainless steel foils and the like. Examples of the heat-resistant polymer film include polyimide films and the like. The transparent electrode layer and the p-i-n type silicon layer are formed by plasma CVD or sputtering in the same manner as described above. That is, the p-i-n type silicon layer is formed on the metal foil or the thin film metal layer formed on the heat-resistant polymer film; and the transparent electrode layer is formed on the p-i-n type silicon layer. Moreover, the thin film metal layer to be formed on the heat-resistant polymer film is also formed by plasma CVD or sputtering.

In this case, the encapsulating layer is provided between the transparent electrode layer and the surface protective member, and between the metal foil or heat-resistant polymer film and the back surface protective member respectively. In this way, the encapsulating layer obtained from an encapsulating material sheet for solar cell is in contact with the electrodes of solar cell elements, such as collector lines, tab-type busbars and conductive layer. According to the aspect (2), the thin film solar cell element has silicon layers that are thinner than those for the crystalline silicon solar cell elements and thus less prone to breakage by the pressure applied during the production of a solar cell module or by external impact during operation of the aforementioned module. For this reason, the encapsulating material sheets for solar cell used for thin film solar cell modules may be less flexible than those used for crystalline silicon solar cell modules. On the other hand, since the electrodes of the thin film solar cell elements are formed of thin film metal layers as described above, there is the risk of significantly decreasing the power generation efficiency when they are degraded by corrosion. Accordingly, the encapsulating material sheets for solar cell of the present invention containing a sheet made of the ethylene resin composition, which is less flexible than an ethylene/vinyl acetate (EVA) copolymer but does not necessarily require a crosslinking agent which causes cracked gas, is more suitably used as an encapsulating material sheet for use in thin film solar cell modules.

Meanwhile, other solar cell module includes a solar cell module using silicon for a solar cell element. Examples of the solar cell module using silicon for a solar cell element include a hybrid type (HIT) solar cell module in which crystalline silicon and amorphous silicon are laminated; a multi-junction type (tandem) solar cell module in which silicon layers with different absorption wavelength ranges are laminated; a back contact type solar cell module in which p-doped regions and n-doped regions are alternately formed on the back surface arranged on a side opposite to the light-incident surface of the solar cell element; and a spherical silicon solar cell module in which a large number of spherical silicon particles (about 1 mm in diameter) and a concave mirror (also serves as an electrode) having a diameter of 2 to 3 mm to increase the light-gathering ability are combined. Other examples of the solar cell module using silicon for a solar cell element include a field-effect solar cell module in which the role of a conventional amorphous silicon p-type window layer with p-i-n junction is changed from "insulated transparent electrode" to "inversion layer induced by electric field effect" and the like. Other examples thereof include a GaAs solar cell module in which monocrystalline GaAs is used for a solar cell element; a CIS or CIGS (chalcopyrite) solar cell module in which I-III-VI compounds called chalcopyrite compounds formed of Cu, In, Ga, Al, Se, S and the like are used instead of silicon as a solar cell element; a CdTe—CdS solar cell module in which thin films of Cd compounds are used as a solar cell element; a $Cu_2ZnSnS_4$ (CZTS) solar cell module; and the like. The encapsulating material for solar cell of the present invention can be used as an encapsulating material for solar cell of all types of the above solar cell modules.

In particular, a filler layer laminated under a photovoltaic device constituting a solar cell module needs to have adhesion to a filler layer, an electrode and a back surface protective layer which are laminated over the photovoltaic device. In order to keep smoothness of the back surface of the solar cell element as a photovoltaic device, the filler layer laminated under a photovoltaic device needs to have thermal plasticity. Furthermore, in order to protect the solar cell element as a photovoltaic device, the filler layer laminated under a photovoltaic device needs to have excellent scratch resistance and shock absorbance.

The above filler layer preferably has heat resistance. In particular, it is preferable that the ethylene resin composition constituting the filler layer does not undergo degeneration, degradation or decomposition due to heating action during the lamination process including vacuum absorbing and heat pressing for the manufacture of a solar cell module, or due to thermal action by sunlight during the long-term operation of the solar cell module. If the additives or the like contained in the ethylene resin composition are eluted, or any decomposed product is generated, they act on the photovoltaic surface (device surface) of the solar cell element to deteriorate their function and performance. Thus, heat resistance is an indispensable property for the filler layer of the solar cell module. The above filler layer preferably has excellent moisture resistance. In this case, excellent moisture resistance prevents moisture permeation from the back surface of the solar cell module, thus avoiding possible corrosion and degradation of the photovoltaic device of the solar cell module.

The above filler layer is different from the filler layer laminated over the photovoltaic device, and needs not necessarily to be transparent. The encapsulating material for solar cell of the present invention has characteristics described above. Thus, the encapsulating material for solar cell of the present invention can be suitably used as an encapsulating material for solar cell on the back surface of the crystalline solar cell module and as an encapsulating material for solar cell of the thin film solar cell module which is susceptible to moisture permeation.

Surface Protective Member for Solar Cell Module

The surface protective member for a solar cell module used for a solar cell module is not particularly limited. However, since the member is located at the outermost layer of the solar cell module, it preferably has such properties that allow long-term reliability for outdoor exposure of the solar cell module, including weather resistance, water repellency, contamination resistance and mechanical strength. The surface protective member is preferably a sheet with less optical loss and high transparency for efficient utilization of sunlight.

Examples of the material of the surface protective member for a solar cell module include resin films made of a polyester resin, a fluorine resin, an acrylic resin, a cyclic olefin (co)polymer or an ethylene-vinyl acetate copolymer, glass substrates and the like. Preferable resin films include films made of a polyester resin excellent in transparency, strength, costs and the like, particularly films made of a polyethylene terephthalate resin, and films made of a fluorine resin having good weather resistance. Examples of the fluorine resin include tetrafluoroethylene/ethylenic copolymers (ETFE), polyvinyl fluoride resins (PVF), polyvinylidene fluoride resins (PVDF), polytetrafluoroethylene resins (TFE), tetrafluoroethylene/hexafluoride propylene copolymers (FEP) and polyethylene chloride trifluoride resins (CTFE). Polyvinylidene fluoride resins are superior in terms of weather resistance. However, tetrafluoroethylene/ethylene copolymers are more superior in terms of both weather resistance and mechanical strength. In order to improve adhesion to the material constituting additional layers such as the encapsulating material layer or the like, the surface protective member is preferably subjected to corona treatment and/or plasma treatment. Moreover, in order to improve mechanical strength, it is also possible to employ a sheet subjected to stretch treatment, such as a biaxially stretched polypropylene sheet.

In the case where a glass substrate is employed as the surface protective member for a solar cell module, the glass substrate preferably has total light transmittance of equal to or more than 80% and more preferably equal to or more than 90%, in the wavelength range of 350 to 1,400 nm. For the glass substrate, super white glass, which has less absorption in the infrared region, is generally used; however, soda lime glass has less effect on the output characteristics of the solar cell module as long as the glass substrate is equal to or less than 3 mm in thickness. Moreover, although reinforced glass can be obtained by thermal treatment to improve the mechanical strength of the glass substrate, a float glass substrate which is not subjected to thermal treatment may be employed. In order to suppress light reflection, the glass substrate may also be provided with antireflective coating on the light-incident surface.

(Back Surface Protective Member for Solar Cell Module)

There are no particular limitations on the back surface protective member for a solar cell module used for a solar cell module. However, since the member is located at the outermost layer of the solar cell module, general properties such as weather resistance, mechanical strength and the like are required in the same manner as in the above surface protective member. Accordingly, the back surface protective member for a solar cell module may be formed of the same material as the surface protective member. That is, the above various materials used as the surface protective member can be used as the back surface protective member. In particular, polyester resins and glass can be suitably used. Moreover, sunlight is not incident on the back surface protective member, so that transparency, which is required for the surface protective member, is not necessarily required. Thus, in order to increase the mechanical strength of the solar cell module, or to prevent deformation or warpage due to the change in temperature, a reinforcement plate may be attached. As the reinforcement plate, for example, a steel plate, a plastic plate, a glass fiber reinforced plastic (FRP) plate or the like can be suitably used.

The encapsulating material for solar cell of the present invention may be integrated with the back surface protective member for a solar cell module. By integrating the encapsulating material for solar cell with the back surface protective member for a solar cell module, it is possible to dispose of the step of cutting both the encapsulating material for solar cell and the back surface protective member for a solar cell module to a size of the module upon module assembling. Moreover, it is possible to shorten or omit the lay-up process by laminating a sheet integrated with the back surface protective member for a solar cell module, rather than individually laminating the encapsulating material for solar cell and the back surface protective member for a solar cell module. When the encapsulating material for solar cell is to be integrated with the back surface protective member for a solar cell module, there are no particular limitations on the lamination method in which the encapsulating material for solar cell is laminated to the back surface protective member for a solar cell module. It is preferable to employ a method in which a laminate is obtained by co-extrusion using a known melt extruder such as a cast molding machine, an extrusion sheet molding machine, an inflation molding machine, an injection molding machine or the like, or a method in which a laminate is obtained by laminating one of the two layers previously formed to the other one by melting or heating.

Moreover, the lamination may be effected through a dry lamination method or a heat lamination method in which a suitable adhesive is used. Examples of the adhesive includes maleic anhydride-modified polyolefin resins such as "ADMER(trademark)" manufactured by Mitsui Chemicals, Inc. and "MODIC(trademark)" manufactured by Mitsubishi Chemical Corporation); low (non) crystalline elastic polymers such as unsaturated polyolefin and the like; acrylic adhesives represented by a terpolymer of ethylene, acrylate and maleic anhydride such as "BONDINE(trademark)" manufactured by Sumica CDF; ethylene/vinyl acetate copolymers; and adhesive resin compositions containing the foregoing.

Adhesives with heat resistance of about 120 to 150 degrees centigrade are preferably used. Specific preferable examples thereof include polyester based or polyurethane based adhesives. In order to improve adhesion between the two layers, at least one of the layers may be subjected to silane coupling treatment, titanium coupling treatment, corona treatment, and/or plasma treatment.

(Solar Cell Element)

There are no particular limitations on the solar cell element used for the solar cell module as long as they can generate electricity by photovoltaic effect of semiconductor. Examples of the solar cell element include silicon (monocrystalline, polycrystalline or amorphous) solar cells, compound semiconductor (III-III Group, II-VI Group and others) solar cells, wet solar cells, organic semiconductor solar cells and the like. Among them, preferably used are polycrystalline silicon solar cells in view of a balance between power generation performance and production costs.

Both the silicon solar cell element and the compound semiconductor solar cell element have superior characteristics as a solar cell element, but are known to be susceptible to breakage by external stress or impact. The encapsulating material for solar cell of the present invention has superior flexibility and thus effectively avoids possible breakage of the solar cell element by absorbing stress or impact to the solar cell element. Accordingly, in the solar cell module of the present invention, it is preferable that a layer made of the encapsulating material for solar cell of the present invention is directly bonded to the solar cell element. Moreover, when the encapsulating material for solar cell has thermal plasticity, the solar cell element can be relatively readily removed even after the manufacture of a solar cell module, thus improving the recycling efficiency. The ethylene resin composition constituting the encapsulating material for solar cell of the present invention has thermal plasticity, and therefore, the encapsulating material for solar cell also has thermal plasticity as a whole, which is preferable in view of the recycling efficiency.

(Electrode)

There are no particular limitations on the structure and material of electrodes used for the solar cell module; in a specific example, the electrode has a laminate structure consisting of a transparent conductive film and a metal film. The transparent conductive film is made of $SnO_2$, ITO, ZnO or the like. The metal film is made of a metal such as silver, gold, copper, tin, aluminum, cadmium, zinc, mercury, chromium, molybdenum, tungsten, nickel, vanadium or the like. These metal films may be used singly or in the form of an alloy. The transparent conductive film and the metal film are formed by CVD, sputtering, evaporation or the like.

(Method for Producing Solar Cell Module)

In order to manufacture solar cell modules, according to a conventional lamination method involving preparing a sheet consisting of an encapsulating material for solar cell in advance, and rolling the sheet at a temperature for melting the sealing material, a module having a construction as described above can be formed in the lamination temperature range of from 120 to 170 degrees centigrade. In this case, the encapsulating material for solar cell exhibits excellent crosslinking characteristics because a specific organic peroxide is contained therein, there is no need to employ an adhering step consisting of two stages in forming a module, and the crosslinking step may be completed at a high temperature in a short period of time. Therefore, the productivity of the module can be particularly improved.

The encapsulating material for solar cell of the present invention is subjected to the lamination process under the aforementioned lamination conditions. Then, to calculate the gel fraction, for example, 1 g of an encapsulating material sheet sample is collected from the solar cell module, Soxhlet extraction is carried out with boiling toluene for 10 hours, followed by filtration through a 30-mesh stainless steel mesh, and then the mesh is dried under reduced pressure at 110 degrees centigrade for 8 hours. When the amount of the residue on the mesh is calculated, the gel fraction is in the range of 70 to 95%, preferably in the range of 70 to 90%. In the case where the gel fraction is less than 50%, heat resistance of the encapsulating material for solar cell is insufficient, so that adhesiveness tends to be lowered in a constant temperature/humidity test at 85 degrees centigrade and 85% RH, a high strength xenon irradiation test at a black panel temperature of 83 degrees centigrade, a heat cycle test at −40 to 90 degrees centigrade, or a heat-resistance test. In the case where the gel fraction exceeds 95%, the flexibility of the encapsulating material for solar cell is lowered, and the temperature follow property in the heat cycle test at −40 to 90 degrees centigrade is lowered, thus causing detachment or the like in some cases.

(Power Generation Equipment)

The solar cell module of the present invention is excellent in the productivity, power generation efficiency, life and the like. Accordingly, a power generation equipment using such a solar cell module is excellent in the costs, power generation efficiency, life and the like, and is of high practical value. The aforementioned power generation equipment can be suitably used for a long period of time regardless whether it is used indoor or outdoor, for example, arrangement on the roof of a building, usage as a portable power source for outdoor activities such as camping, or usage as an auxiliary power source for car batteries.

EXAMPLES

The present invention is now illustrated in detail below with reference to Examples. However, the present invention is not restricted to these Examples.
(1) Measurement Method
[Content Ratios of Ethylene Units and α-Olefin Units]

A solution obtained by dissolving 0.35 g of a sample in 2.0 ml of hexachlorobutadiene under heating was filtered using a glass filter (G2), and then 0.5 ml of deuterated benzene was added thereto. The resulting mixture was fed into an NMR tube having an internal diameter of 10 mm. The $^{13}$C-NMR was measured at 120 degrees centigrade using a JNM GX-400 type NMR measuring apparatus manufactured by JEOL Ltd. The number of integrations was equal to or more than 8,000 times. The content ratio of the ethylene units and the content ratio of the α-olefin units in the copolymer were quantitatively analyzed from the resulting $^{13}$C-NMR spectrum.
[MFR]

MFR of an ethylene/α-olefin copolymer was measured under the conditions of a temperature of 190 degrees centigrade and a load of 2.16 kg in accordance with ASTM D1238.
[Density]

The density of an ethylene/α-olefin copolymer was measured in accordance with ASTM D1505.
[Shore A Hardness]

An ethylene/α-olefin copolymer was heated at 190 degrees centigrade and pressurized at 10 MPa for 4 minutes, and then pressurized at 10 MPa and cooled down to a normal temperature for 5 minutes to obtain a sheet having a thickness of 3 mm. The shore A hardness of the ethylene/α-olefin copolymer was measured by using the resulting sheet in accordance with ASTM D2240.
[Glass Adhesion Strength]

A transparent glass plate as the surface protective member for a solar cell and a sheet sample having a thickness of 500 μm were laminated. The resulting laminate was fed into a vacuum laminator, placed on a hot plate at a temperature controlled to 150 degrees centigrade, placed under reduced pressure for 3 minutes and heated for 15 minutes, whereby a sample for adhesion strength, that is, a laminate consisting of a transparent glass plate and a sheet sample, was prepared. A sheet sample layer of this sample for glass adhesion strength was cut to a size of a width of 10 mm, and the peel strength (glass adhesion strength) to glass was measured in a 180 degree peel test. A tensile tester (product name: Instron1123 manufactured by Instron Corporation) was used for the measurement. In the 180 degree peel test, the peel strength was measured at 23 degrees centigrade at a distance between spans of 30 mm with a tensile speed of 30 mm/minute to adopt an average value of 3 measured values.

[Metal Adhesion Strength]

A transparent glass plate, that is, a surface protective member for solar cells, a sheet sample having a thickness of 500 μm, a copper foil (ESPANEX SB12-25-12CE, a product of Nippon Steel & Sumikin Chemical Co., Ltd.) and a sheet sample having a thickness of 500 μm were laminated. The resulting laminate was fed into a vacuum laminator, placed on a hot plate at a temperature controlled to 150 degrees centigrade, placed under reduced pressure for 3 minutes and heated for 15 minutes, whereby a sample for metal adhesion strength, that is, a laminate consisting of a transparent glass plate, a sheet sample, a copper foil and a sheet sample, was prepared. A sheet sample layer of this sample for metal adhesion strength was cut to a size of a width of 15 mm, and the peel strength (metal adhesion strength) to the copper foil was measured in a 180 degree peel test. A tensile tester (product name: Instron1123, a product of Instron Corporation) was used for the measurement. In the 180 degree peel test, the peel strength was measured at 23 degrees centigrade at a distance between spans of 30 mm with a tensile speed of 30 mm/minute to adopt an average value of 3 measured values.
[Total Light Transmittance]

Super white glass without having an absorption region in the wavelength range of 350 to 800 nm was used to obtain a laminate consisting of super white glass, a sheet sample and super white glass under the same conditions as those for the preparation of the above sample for adhesion strength. Using a spectrophotometer (product name: U-3010 manufactured by Hitachi, Ltd.) equipped with an integrating sphere of ϕ150 mm, the total light transmittance of the sheet sample in the above laminate was measured in the wavelength range of 350 to 800 nm. The total light transmittance of visible light (Tvis) was calculated by multiplying standard light D65 and standard luminous efficiency function V(λ) by measurement results.
[Volume Resistivity]

The resulting sheet was cut to a size of 10 cm×10 cm, and then a crosslinked sheet for measurement was prepared by laminating at 150 degrees centigrade under vacuum for 3 minutes with an applied pressure for 15 minutes. The volume resistivity (Ω·cm) of the prepared crosslinked sheet was measured with an applied voltage of 500 V in accordance with JIS K6911. Incidentally, during the measurement, a pyrometry chamber, 12708 (a product of Advantest Corporation), was used at a temperature of 100±2 degrees centigrade, and a microammeter R8340A (a product of Advantest Corporation) was used.
[Cell Breakage]

A silicon cell having a thickness of 150 μm was cut from an ingot and obtained a laminate consisting of super white glass, a sheet sample, a silicon cell, a sheet sample and a PET backsheet under the same conditions as those for the preparation of the above sample for adhesion strength. The silicon cell in the resulting laminate was visually observed to evaluate breakage.
[Crosslinking Properties]
(Most Suitable Crosslinking Time Tc90)

The time Tc90 (min) required to reach a torque value corresponding to the sum of 90% of the difference between maximum torque value S' max and minimum torque value S' min and minimum torque S' min was measured from a crosslinking curve of the resulting sheet sample in accordance with JIS-K6300-2 under the conditions of a crosslinking temperature of 150 degrees centigrade and a crosslinking time of 30 minutes, using a curelastometer (CURELASTOMETER-V type, a product of Orientec Co., Ltd.).

[Bubble]

A sheet sample was placed on a blue glass (3 mm (thickness)×12 cm×7.5 cm), and then two aluminum plates cut at 3 square-cm and having a thickness of 0.2 mm were put thereon at an interval of 2 cm. The resulting material was fixed with an adhesive tape made of a polytetrafluoroethylene substrate having a size of 1 cm (width)×3 cm (length). Next, a sheet sample was further placed thereon, and lastly, a PET backsheet was laminated. The resulting material was put on a hot plate at a temperature controlled to 150 degrees centigrade, placed under reduced pressure for 3 minutes and heated for 15 minutes for bonding the components, and then the appearance after crosslinking/adhering was observed (blistering at an early stage). Furthermore, the material was put in an oven at a temperature of 130 degrees centigrade and subjected to a heat-resistance test for 250 hours, and then the appearance was observed (blistering after the heat-resistance test). Generation of bubbles was evaluated according to the following criteria.

○: No particular change in the appearance

Δ: Slight change in the appearance observed at a place where an adhesive tape was attached x: Blistering observed at a place where an adhesive tape was attached

[Sheet Blocking Property]

Two sheets were laminated together such that the embossed surface of the sheet sample was placed on the top. The laminate was composed of glass, a sheet sample, a sheet sample and glass with the embossed surface on the top, and a weight of 400 g was placed on the embossed surface. The resulting material was allowed to stand in an oven at 40 degrees centigrade for 24 hours, was taken out, and was cooled down to a room temperature to measure the peel strength of the sheet. The measurement was carried out using a tensile tester (product name: Instron1123 manufactured by Instron Corporation) in a 180 degree peel test between the sheets under the conditions of a temperature of 23 degrees centigrade, a distance between spans of 30 mm and a tensile speed of 10 mm/minute. Using an average value of 3 measured values, sheet blocking property was evaluated according to the following criteria:

Good (A): Peel strength of less than 50 gf/cm

Slight blocking (B): Peel strength of 50 to 100 gf/cm

Blocking (C): Peel strength of exceeding 100 gf/cm (2) Synthesis of Ethylene/α-Olefin Copolymer Synthesis Example 1

Into one supply port of a continuous polymerization reactor having an interior volume of 50 L equipped with a stirring blade were fed a toluene solution of methyl aluminoxane at a rate of 1.95 mmol/hr as a cocatalyst, a hexane solution of [dimethyl(t-butylamide)(tetramethyl-η5-cyclopentadienyl)silane]titanium dichloride at a rate of 0.013 mmol/hr as a main catalyst, and a hexane solution of triisobutylaluminum at a rate of 9.75 mmol/hr as a scavenger, and there was continuously fed normal hexane which was purified by dehydration such that the total amount of a catalyst solution and normal hexane purified by dehydration used as a polymerization solvent was 20 L/hr. At the same time, into another supply port of the polymerization reactor were continuously fed ethylene at a rate of 3 kg/hr, 1-butene at a rate of 5 kg/hr and hydrogen at a rate of 100 NL/hr. Continuous solution polymerization was carried out under the conditions of a polymerization temperature of 90 degrees centigrade, a total pressure of 3 MPaG and a retention time of 1.0 hour. A normal hexane/toluene mixed solution of an ethylene/α-olefin copolymer produced at the polymerization reactor was continuously discharged through an outlet arranged at the bottom of the polymerization reactor, and the normal hexane/toluene mixed solution of an ethylene/α-olefin copolymer was introduced into a connection pipe with a jacket section heated at a steam pressure of 3 to 25 kg/cm$^2$ so as to be 150 to 190 degrees centigrade. In addition, immediately before reaching the connection pipe, a supply port into which methanol as a catalyst deactivator was injected was arranged, and methanol was injected at a rate of about 0.75 L/hr and was flowed into the normal hexane/toluene mixed solution of an ethylene/α-olefin copolymer. The normal hexane/toluene mixed solution of an ethylene/α-olefin copolymer maintained at a temperature of about 190 degrees centigrade inside the steam jacket-attached connection pipe was continuously sent to a flush chamber by controlling opening of a pressure control valve attached to the edge section of the connection pipe so as to maintain a pressure of about 4.3 MPaG. Furthermore, in the transport of the solution into the flush chamber, the solution temperature and opening of the pressure control valve were set such that a pressure inside the flush chamber was maintained at about 0.1 MPaG and a temperature of the steam section inside the flush chamber was maintained at about 180 degrees centigrade. Thereafter, passing through a single screw extruder set at a die temperature of 180 degrees centigrade, strands were cooled in a water chamber and were cut using a pellet cutter, whereby an ethylene/α-olefin copolymer was obtained as a pellet. The yield was 2.1 kg/hr. Physical properties are shown in Table 1.

Synthesis Example 2 to 9

An ethylene/α-olefin copolymer was obtained in the same manner as in the aforementioned Synthesis Example 1, except that respective concentrations of a main catalyst, a cocatalyst and a scavenger, the amounts of 1-butene and hydrogen supplied, 1-octene supplied instead of 1-butene, and polymerization conditions such as polymerization temperature and polymerization pressure were changed. Physical properties of the resulting copolymer (A) are shown in Table 1.

TABLE 1

|  | Synthesis Example 1 | Synthesis Example 2 | Synthesis Example 3 | Synthesis Example 4 | Synthesis Example 5 |
| --- | --- | --- | --- | --- | --- |
| MFR [g/10 min] | 11 | 20 | 48 | 9.5 | 51 |
| Shore A Hardness [—] | 62 | 70 | 84 | 60 | 84 |
| α-olefin Type | 1-butene | 1-butene | 1-octene | 1-butene | 1-octene |
| Content of α-olefin unit [mol %] | 17 | 14 | 11 | 18 | 11 |

TABLE 1-continued

| Content of ethylene unit [mol %] | 83 | 86 | 89 | 82 | 89 |
|---|---|---|---|---|---|
| Density [g/cm³] | 0.866 | 0.870 | 0.884 | 0.865 | 0.884 |

|  | Synthesis Example 6 | Synthesis Example 7 | Synthesis Example 8 | Synthesis Example 9 |
|---|---|---|---|---|
| MFR [g/10 min] | 11 | 11 | 4.0 | 2.1 |
| Shore A Hardness [—] | 56 | 86 | 70 | 84 |
| α-olefin Type | 1-butene | 1-butene | 1-butene | 1-octene |
| Content of α-olefin unit [mol %] | 21 | 11 | 14 | 11 |
| Content of ethylene unit [mol %] | 79 | 89 | 86 | 89 |
| Density [g/cm³] | 0.863 | 0.885 | 0.870 | 0.884 |

(3) Production of Encapsulating Material for Solar Cell (Sheet)

Example 1

There were blended 0.3 weight parts of γ-methacryloxypropyltrimethoxy silane as an ethylenically unsaturated silane compound, 0.7 weight part in terms of 1,1-di(t-butylperoxy)cyclohexane of the mixture liquid (organic peroxide 1) which was diluted with a hydrocarbon-based liquid 80% of 1,1-di(t-butylperoxy)cyclohexane having a one-hour half-life temperature of 116 degrees centigrade as organic peroxide, 1.2 weight parts of triallyl isocyanurate as a crosslinking aid, 0.4 weight parts of 2-hydroxy-4-n-octyloxybenzophenone as an ultraviolet absorber, 0.2 weight parts of bis(2,2,6,6-tetramethyl-4-piperidyl)sebacate as a hindered amine type light stabilizer and 0.05 weight part of pentaerythritoltetrakis[3-(3,5-di-tert-butyl-4-hydroxyphenyl)propionate] as a hindered phenol antioxidant, based on 100 weight parts of the ethylene/α-olefin copolymer of Synthesis Example 1. A single screw extruder (screw diameter: 20 mmφ, L/D=28) manufactured by Thermoplastic Company was equipped with a coat hanger-type T-die (lip shape: 270×0.8 mm), and molding was carried out at a die temperature of 100 degrees centigrade, a roll temperature of 30 degrees centigrade, at a take up rate of 1.0 m/min using an embossing roll for a first chill roll, whereby an embossed sheet (encapsulating material sheet for solar cell) having a thickness of 500 μm was obtained. The porosity of the resulting sheet was 28%. Various evaluation results of the resulting sheet are shown in Table 2.

Examples 2 to 5

Embossed sheets (encapsulating material sheets for solar cell) were obtained in the same manner as in Example 1 described above, except for blending shown in Table 2. The porosities of the resulting sheets were all 28%. Various evaluation results of the resulting sheets are shown in Table 2.

Comparative Examples 1 to 6

Embossed sheets (encapsulating material sheets for solar cell) were obtained in the same manner as in Example 1 described above, except for blending shown in Table 2. The porosities of the resulting sheets were all 28%. Various evaluation results of the resulting sheets are shown in Table 2.

Comparative Examples 7 to 9

An embossed sheet (encapsulating material for solar cell sheet) was obtained in the same manner as in the aforementioned Example 1, except that an ethylene/vinyl acetate polymer containing 26 weight % of vinyl acetate and having MFR of 15 g/10 min was used instead of the ethylene/α-olefin copolymer, and composition shown in Table 2 was used. The porosities of the resulting sheets were all 28%. Various evaluation results of the resulting sheet are shown in Table 2.

In Table 2 and Table 3 to be described below, organic peroxides 1 to 5 are used as shown below.

Organic peroxide 1: 1-hour half-life temperature of 116 degrees centigrade; 1,1-di(t-butylperoxy)cyclohexane/hydrocarbon-based liquid, 80 weight %, diluted product Organic peroxide 2: 1-hour half-life temperature of 102 degrees centigrade; 1,1-di(t-butylperoxy)-2-methylcyclohexane/hydrocarbon-based liquid, 85 weight %, diluted product Organic peroxide 3: 1-hour half-life temperature of 121 degrees centigrade; t-butylperoxy-2-ethylhexyl carbonate Organic peroxide 4: 1-hour half-life temperature of 140 degrees centigrade; 2,5-dimethyl-2,5-di(t-butylperoxy)hexane Organic peroxide 5: 1-hour half-life temperature of 107 degrees centigrade; 1,1-di(t-hexylperoxy)cyclohexane/pure form, 90 weight %

TABLE 2

|  | Example 1 | Example 2 | Example 3 | Example 4 | Example 5 |
|---|---|---|---|---|---|
| Composition (weight parts) |  |  |  |  |  |
| Ethylene/α-olefin copolymer |  |  |  |  |  |
| Synthesis Example 1 | 100 |  |  |  |  |
| Synthesis Example 2 |  | 100 |  | 100 |  |
| Synthesis Example 3 |  |  | 100 |  | 100 |
| Synthesis Example 4 |  |  |  |  |  |

TABLE 2-continued

|  |  |  |  |  |  |
|---|---|---|---|---|---|
| Synthesis Example 5 |  |  |  |  |  |
| Synthesis Example 6 |  |  |  |  |  |
| Synthesis Example 7 |  |  |  |  |  |
| EVA |  |  |  |  |  |
| Ethylenically unsaturated silane compound | 0.3 | 0.3 | 0.3 | 0.3 | 0.3 |
| Organic peroxide 1 | 0.7 |  |  | 0.3 | 0.75 |
| Organic peroxide 2 |  |  | 0.15 |  |  |
| Organic peroxide 3 |  |  |  | 0.2 |  |
| Organic peroxide 4 |  |  |  |  |  |
| Organic peroxide 5 |  | 0.4 |  |  |  |
| Crosslinking aid | 1.2 | 1.2 | 1.2 | 1.2 | 1.2 |
| UV absorber | 0.4 | 0.4 | 0.4 | 0.4 | 0.4 |
| Hindered amine light stabilizer | 0.2 | 0.2 | 0.2 | 0.2 | 0.2 |
| Hindered phenol type antioxidant | 0.05 | 0.05 | 0.05 | 0.05 | 0.05 |
| Evaluation |  |  |  |  |  |
| Total light transmittance [%] | 93 | 92 | 90 | 90 | 90 |
| Glass adhesion strength [N/cm] | 21 | 16 | 15 | 19 | 12 |
| Metal adhesion strength [N/cm] | 6 | 5 | 3 | 4 | 6 |
| Cell breakage | No change | No change | No change | No change | No change |
| Blistering at early stage [—] | ○ | ○ | ○ | ○ | Δ |
| Blistering after 130° C. × 250 hr [—] | Δ | ○ | ○ | ○ | Δ |
| Specific volume resistance at 100° C. [Ω · cm] | $1.5 \times 10^{15}$ | $2.1 \times 10^{15}$ | $2.5 \times 10^{15}$ | $2.6 \times 10^{15}$ | $2.3 \times 10^{15}$ |
| Most suitable crosslinking time [Ts90] [min] | 7.2 | 9.2 | 11.3 | 10.2 | 7.1 |
| Sheet blocking property | Good | Good | Good | Good | Good |
| Sheet appearance | Good | Good | Good | Good | Good |

|  | Comparative Example 1 | Comparative Example 2 | Comparative Example 3 | Comparative Example 4 | Comparative Example 5 |
|---|---|---|---|---|---|
| Composition (weight parts) |  |  |  |  |  |
| Ethylene/α-olefin copolymer |  |  |  |  |  |
| Synthesis Example 1 |  |  |  | 100 |  |
| Synthesis Example 2 |  |  |  |  |  |
| Synthesis Example 3 |  | 100 | 100 |  | 100 |
| Synthesis Example 4 |  |  |  |  |  |
| Synthesis Example 5 |  |  |  |  |  |
| Synthesis Example 6 | 100 |  |  |  |  |
| Synthesis Example 7 |  |  |  |  |  |
| EVA |  |  |  |  |  |
| Ethylenically unsaturated silane compound | 0.3 | 0.3 | 0.3 | 0.3 | 0.3 |
| Organic peroxide 1 | 0.5 | 0.8 |  |  |  |
| Organic peroxide 2 |  |  | 0.05 |  |  |
| Organic peroxide 3 |  |  |  | 0.9 |  |
| Organic peroxide 4 |  |  |  |  | 1.5 |
| Organic peroxide 5 |  |  |  |  |  |
| Crosslinking aid | 1.2 | 1.2 | 1.2 | 1.2 | 1.2 |
| UV absorber | 0.4 | 0.4 | 0.4 | 0.4 | 0.4 |
| Hindered amine light stabilizer | 0.2 | 0.2 | 0.2 | 0.2 | 0.2 |
| Hindered phenol type antioxidant | 0.05 | 0.05 | 0.05 | 0.05 | 0.05 |
| Evaluation |  |  |  |  |  |
| Total light transmittance [%] | 93 | 90 | 91 | 92 | 91 |
| Glass adhesion strength [N/cm] | 10 | 10 | 9 | 18 | 12 |
| Metal adhesion strength [N/cm] | 4 | 5 | 1 | 0 | 7 |
| Cell breakage | No change | No change | No change | No change | No change |
| Blistering at early stage [—] | Δ | Δ | ○ | Δ | x |
| Blistering after 130° C. × 250 hr [—] | x | x | ○ | x | x |

TABLE 2-continued

| | | | | | |
|---|---|---|---|---|---|
| Specific volume resistance at 100° C. [Ω · cm] | $9.8 \times 10^{14}$ | $2.4 \times 10^{15}$ | $8.5 \times 10^{14}$ | $2.5 \times 10^{15}$ | $8.7 \times 10^{15}$ |
| Most suitable crosslinking time [Ts90] [min] | — | 6.1 | 12.1 | 10.1 | 10.1 |
| Sheet blocking property | Blocking | Good | Good | Good | Good |
| Sheet appearance | Good | A little gelated | Good | Good | Good |

| | Comparative Example 6 | Comparative Example 7 | Comparative Example 8 | Comparative Example 9 |
|---|---|---|---|---|
| Composition (weight parts) Ethylene/α-olefin copolymer | | | | |
| Synthesis Example 1 | 100 | | | |
| Synthesis Example 2 | | | | |
| Synthesis Example 3 | | | | |
| Synthesis Example 4 | | | | |
| Synthesis Example 5 | | | | |
| Synthesis Example 6 | | | | |
| Synthesis Example 7 | | | | |
| EVA | | 100 | 100 | 100 |
| Ethylenically unsaturated silane compound | 0.3 | 0.5 | 0.5 | 0.5 |
| Organic peroxide 1 | | 0.5 | 0.9 | |
| Organic peroxide 2 | | | | |
| Organic peroxide 3 | 0.8 | | | 0.7 |
| Organic peroxide 4 | | | | |
| Organic peroxide 5 | | | | |
| Crosslinking aid | 1.2 | 1.2 | 1.2 | 1.2 |
| UV absorber | 0.4 | | | |
| Hindered amine light stabilizer | 0.2 | | | |
| Hindered phenol type antioxidant | 0.05 | 0.05 | 0.05 | 0.05 |
| Evaluation | | | | |
| Total light transmittance [%] | 92 | 91 | 91 | 91 |
| Glass adhesion strength [N/cm] | 18 | 18 | 21 | 20 |
| Metal adhesion strength [N/cm] | 0 | 5 | 6 | 2 |
| Cell breakage | No change | No change | No change | No change |
| Blistering at early stage [—] | Δ | ◯ | ◯ | ◯ |
| Blistering after 130° C. × 250 hr [—] | x | ◯ | ◯ | ◯ |
| Specific volume resistance at 100° C. [Ω · cm] | $2.4 \times 10^{15}$ | $3.2 \times 10^{12}$ | $2.9 \times 10^{12}$ | $3.3 \times 10^{12}$ |
| Most suitable crosslinking time [Ts90] [min] | 9.1 | 8.5 | 5.6 | 9.1 |
| Sheet blocking property | Good | Good | Good | Good |
| Sheet appearance | Good | Good | Good | Good |

Examples 6 to 8

Blending of the ethylene composition shown in Table 3. 100 g of the blended ethylene composition was fed into a mixing roll machine made by Toyo Seiki Co., Ltd (having two rolls with diameters of 5 inches and rotation speeds of 18 rpm and 15 rpm) having a surface temperature of 100 degrees centigrade, and molding was carried out by calender rolls, whereby calender sheets having a thickness of 500 μm (sheets of encapsulating material for solar cell) were obtained. Various evaluation results of the resulting sheets are shown in Table 3.

Comparative Example 10

A calender sheets having a thickness of 500 μm (encapsulating material sheets for solar cell) was obtained in the same manner as in Example 6 described above, except for blending shown in Table 3. Various evaluation results of the resulting sheet are shown in Table 3.

TABLE 3

| | Example 6 | Example 7 | Example 8 | Comparative Example 10 |
|---|---|---|---|---|
| Composition (weight parts) Ethylene/α-olefin copolymer | | | | |
| Synthesis Example 4 | 100 | | | 100 |
| Synthesis Example 8 | | 100 | | |
| Synthesis Example 9 | | | 100 | |

TABLE 3-continued

|  | Example 6 | Example 7 | Example 8 | Comparative Example 10 |
|---|---|---|---|---|
| Ethylenically unsaturated silane compound | 0.3 | 0.3 | 0.3 | 0.3 |
| Organic peroxide 1 | 0.75 |  |  | 0.80 |
| Organic peroxide 2 |  | 0.3 |  |  |
| Organic peroxide 3 |  | 0.1 |  |  |
| Organic peroxide 4 |  |  |  |  |
| Organic peroxide 5 |  |  | 0.4 |  |
| Crosslinking aid | 1.2 | 1.2 | 1.2 | 1.2 |
| UV absorber | 0.4 | 0.4 | 0.4 | 0.4 |
| Hindered amine light stabilizer | 0.2 | 0.2 | 0.2 | 0.2 |
| Hindered phenol type antioxidant | 0.05 | 0.05 | 0.05 | 0.05 |
| Evaluation |  |  |  |  |
| Total light transmittance [%] | 93 | 92 | 90 | 93 |
| Glass adhesion strength [N/cm] | 35 | 38 | 34 | 36 |
| Metal adhesion strength [N/cm] | 9 | 7 | 8 | 9 |
| Cell breakage | No change | No change | No change | No change |
| Blistering at early stage [—] | ○ | ○ | ○ | Δ |
| Blistering after 130° C. × 250 hr [—] | Δ | ○ | ○ | x |
| Specific volume resistance at 100° C. [Ω · cm] | $2.1 \times 10^{15}$ | $2.3 \times 10^{15}$ | $2.5 \times 10^{15}$ | $2.0 \times 10^{15}$ |
| Most Suitable Crosslinking Time [Ts90] [min] | 6.8 | 10.1 | 9.2 | 6.1 |
| Sheet appearance | Good | Good | Good | Good |

The encapsulating material for solar cell of the present invention is excellent in a balance among general properties such as transparency, adhesiveness, flexibility, appearance, crosslinking properties, electrical properties and extrusion moldability, and bubbles are not generated during the lamination and crosslinking process at the time of manufacturing a solar cell module and during long-term usage. Therefore, the encapsulating material for solar cell of the present invention can be used to provide a solar cell module superior in appearance, performance, and economic efficiency such as the costs or the like.

The invention claimed is:

1. An encapsulating material for solar cell containing an ethylene/α-olefin copolymer satisfying the following a1) and a2)-1, and a peroxyketal represented by the following general formula (1) and having a 1-hour half-life temperature in a range of 100 to 135 degrees centigrade; the peroxyketal being contained in an amount of 0.1 to less than 0.8 weight parts relative to 100 weight parts of the ethylene/α-olefin copolymer, wherein the α-olefin in the ethylene/α-olefin copolymer includes at least one or more kinds selected from propylene, 1-butene, 1-pentene, 1-hexene, 3-methyl-1-butene, 3,3-dimethyl-1-butene, 4-methyl-1-pentene, and 1-octene, and wherein the encapsulating material comprises organic peroxide consisting of the peroxyketal of Chemical Formal 1, with a1) the shore A hardness is from 60 to 85 as measured in accordance with ASTM D2240;

a2)-1 MFR is from 10 to 50 g/10 minutes as measured under the conditions of a temperature of 190 degrees centigrade and a load of 2.16 kg in accordance with ASTM D1238

[Chemical Formula 1]

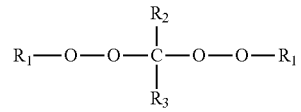

(1)

wherein in the above general formula (1), $R_1$s are each independently a straight-chain or branched alkyl group having 3 to 8 carbon atoms, and $R_2$ and $R_3$ are each independently a straight-chain or branched alkyl group having 1 to 8 carbon atoms, or $R_2$ and $R_3$ may be bonded together to form an aliphatic ring having 5 to 9 carbon atoms or an alkyl-substituted aliphatic ring.

2. The encapsulating material for solar cell according to claim 1, wherein the ethylene/α-olefin copolymer satisfies the following a3) and a4):

a3) the content ratio of structural units derived from ethylene is from 80 to 90 mol % and the content ratio of structural units derived from α-olefin having 3 to 20 carbon atoms is from 10 to 20 mol %;

a4) the density is from 0.865 to 0.884 g/cm³ as measured in accordance with ASTM D1505.

3. The encapsulating material for solar cell according to claim 1, wherein the ethylene/α-olefin copolymer is an ethylene/α-olefin/non-conjugated polyene copolymer and satisfies the following a5):

a5) the content ratio of structural units derived from ethylene is from 80 to 90 mol %, the content ratio of structural units derived from α-olefin having 3 to 20 carbon atoms is from 9.99 to 19.99 mol %, and the content ratio of structural units derived from non-conjugated polyene is from 0.01 to 5.0 mol %.

4. The solar cell sealing material according to claim 1, wherein the peroxyketal is at least one or more kinds selected from the following general formulae (2) to (4):

[Chemical Formula 2]

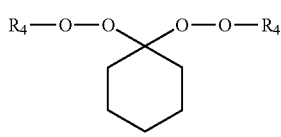

(2)

In the above general formula (2), $R_4$s each independently represent a straight-chain or branched alkyl group having 3 to 8 carbon atoms;

[Chemical Formula 3]

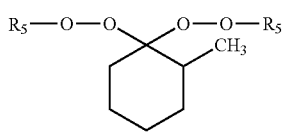

(3)

wherein in the above general formula (3), $R_5$s each independently represent a straight-chain or branched alkyl group having 3 to 8 carbon atoms;

[Chemical Formula 4]

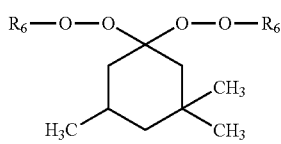

(4)

wherein in the above general formula (4), $R_6$s each independently represent a straight-chain or branched alkyl group having 3 to 8 carbon atoms.

5. The encapsulating material for solar cell according to claim 1, wherein the encapsulating material for solar cell comprises a silane coupling agent in an amount of 0.1 to 5 weight parts, based on 100 weight parts of the ethylene/α-olefin copolymer.

6. The encapsulating material for solar cell according to claim 5, wherein the encapsulating material for solar cell further comprises at least one kind selected from the group consisting of an ultraviolet absorber, a heat-resistant stabilizer and a hindered amine type light stabilizer in an amount of 0.005 to 5 weight parts, based on 100 weight parts of the ethylene/α-olefin copolymer.

7. The encapsulating material for solar cell according to claim 6, wherein the encapsulating material for solar cell further comprises a crosslinking aid in an amount of 0.05 to 5 weight parts, based on 100 weight parts of the ethylene/α-olefin copolymer.

8. The encapsulating material for solar cell according to claim 1, wherein the material is in a sheet form.

9. A method for manufacturing the encapsulating material for solar cell as described in claim 8, in which the resin composition containing the ethylene/α-olefin copolymer and the peroxyketal represented by the above general formula (1) is molded into a film form by melt-extrusion molding.

10. An encapsulating material for solar cell containing an ethylene/α-olefin copolymer satisfying the following a1) and a2)-2, and a peroxyketal represented by the following general formula (1) and having a 1-hour half-life temperature in a range of 100 to 135 degrees centigrade; the peroxyketal being contained in an amount of 0.1 to less than 0.8 weight parts relative to 100 weight parts of the ethylene/α-olefin copolymer, wherein the α-olefin in the ethylene/α-olefin copolymer includes at least one or more kinds selected from propylene, 1-butene, 1-pentene, 1-hexene, 3-methyl-1-butene, 3, 3-dimethyl-1-butene, 4-methyl-1-pentene, and 1-octene, and wherein the encapsulating material comprises organic peroxide consisting of the peroxyketal of Chemical Formula 1, with a1) the shore A hardness is from 60 to 85 as measured in accordance with ASTM D2240;

a2)-2 MFR is equal to or more than 2 g/10 minutes and less than 10 g/10 minutes as measured under the conditions of a temperature of 190 degrees centigrade and a load of 2.16 kg in accordance with ASTM D1238

[Chemical Formula 1]

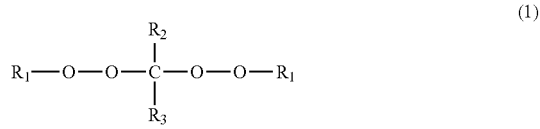

(1)

wherein in the above general formula (1), $R_1$s are each independently a straight-chain or branched alkyl group having 3 to 8 carbon atoms, and $R_2$ and $R_3$ are each independently a straight-chain or branched alkyl group having 1 to 8 carbon atoms, or $R_2$ and $R_3$ may be bonded together to form an aliphatic ring having 5 to 9 carbon atoms or an alkyl-substituted aliphatic ring.

11. The encapsulating material for solar cell according to claim 10, wherein the ethylene/α-olefin copolymer satisfies the following a3), a4) and a5):

a3) the content ratio of structural units derived from ethylene is from 80 to 90 mol % and the content ratio of structural units derived from α-olefin having 3 to 20 carbon atoms is from 10 to 20 mol %;

a4) the density is from 0.865 to 0.884 g/cm³ as measured in accordance with ASTM D1505;

a5) the content ratio of structural units derived from ethylene is from 80 to 90 mol %, the content ratio of structural units derived from α-olefin having 3 to 20 carbon atoms is from 9.99 to 19.99 mol %, and the content ratio of structural units derived from non-conjugated polyene is from 0.01 to 5.0 mol %.

12. The solar cell sealing material according to claim 10, wherein the peroxyketal is at least one or more kinds selected from the following general formulae (2) to (4):

[Chemical Formula 2]

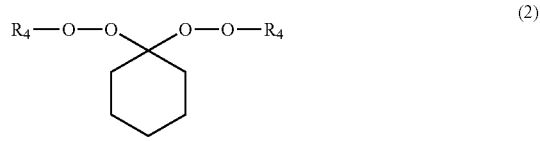

(2)

wherein in the above general formula (2), $R_4$s each independently represent a straight-chain or branched alkyl group having 3 to 8 carbon atoms;

[Chemical Formula 3]

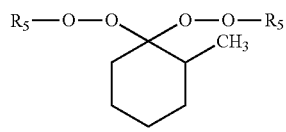
(3)

In the above general formula (3), $R_5$s each independently represent a straight-chain or branched alkyl group having 3 to 8 carbon atoms;

[Chemical Formula 4]

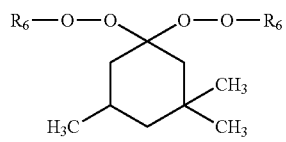
(4)

wherein in the above general formula (4), $R_6$s each independently represent a straight-chain or branched alkyl group having 3 to 8 carbon atoms.

13. The encapsulating material for solar cell according to claim 10, wherein the material is in a sheet form.

14. A method for manufacturing the encapsulating material for solar cell as described in claim 13, in which the resin composition containing the ethylene/α-olefin copolymer and the peroxyketal represented by the above general formula (1) is molded into a film form by calender molding.

15. A solar cell module comprising:
a surface protective member;
a back surface protective member;
a solar cell element; and
an encapsulating layer for encapsulating the solar cell element between the surface protective member and the back surface protective member to be formed by crosslinking the encapsulating material for solar cell according to claim 13.

* * * * *